United States Patent
Soler Castany et al.

(10) Patent No.: US 10,320,079 B2
(45) Date of Patent: Jun. 11, 2019

(54) INTEGRATED CIRCUIT PACKAGE INCLUDING MINIATURE ANTENNA

(71) Applicant: Fractus, S.A., Barcelona (ES)

(72) Inventors: Jordi Soler Castany, Mataro (ES); Jaume Anguera Pros, Vinaros (ES); Carles Puente Baliarda, Barcelona (ES); Carmen Borja Borau, Barcelona (ES)

(73) Assignee: Fractus, S.A., Sant Cugat del Valles, Barcelona (ES)

( * ) Notice: Subject to any disclaimer, the term of this patent is extended or adjusted under 35 U.S.C. 154(b) by 0 days.

(21) Appl. No.: 16/041,382

(22) Filed: Jul. 20, 2018

(65) Prior Publication Data

US 2018/0331427 A1 Nov. 15, 2018

Related U.S. Application Data

(63) Continuation of application No. 15/673,164, filed on Aug. 9, 2017, now Pat. No. 10,056,691, which is a (Continued)

(51) Int. Cl.
*H01Q 1/00* (2006.01)
*H01Q 9/04* (2006.01)
(Continued)

(52) U.S. Cl.
CPC ............ *H01Q 9/045* (2013.01); *H01L 23/66* (2013.01); *H01L 25/165* (2013.01); *H01Q 1/22* (2013.01);
(Continued)

(58) Field of Classification Search
CPC ........ H01Q 1/242; H01Q 1/38; H01Q 9/0421; H01Q 1/241
See application file for complete search history.

(56) References Cited

U.S. PATENT DOCUMENTS

| 2,780,808 A | 12/1953 | Middlemark |
| 3,778,717 A | 12/1973 | Okoshi |

(Continued)

FOREIGN PATENT DOCUMENTS

| DE | 19500925 | 7/1996 |
| EP | 0523564 | 1/1993 |

(Continued)

OTHER PUBLICATIONS

Addison , P. S., Fractals and Chaos—An illustrated course—Full, Institute of Physics Publising Bristol and Philadelphia Jan. 1, 1997.
(Continued)

*Primary Examiner* — Huedung X Mancuso
(74) *Attorney, Agent, or Firm* — Edell, Shapiro & Finnan, LLC

(57) ABSTRACT

The present invention relates to an integrated circuit package comprising at least one substrate, each substrate including at least one layer, at least one semiconductor die, at least one terminal, and an antenna located in the integrated circuit package, but not on said at least one semiconductor die. The conducting pattern comprises a curve having at least five sections or segments, at least three of the sections or segments being shorter than one-tenth of the longest free-space operating wavelength of the antenna, each of the five sections or segments forming a pair of angles with each adjacent segment or section, wherein the smaller angle of each of the four pairs of angles between sections or segments is less than 180° (i.e., no pair of sections or segments define a longer straight segment), wherein at least two of the angles are less than 115°, wherein at least two of the angles are not equal, and wherein the curve fits inside a rectangular area the longest edge of which is shorter than one-fifth of the longest free-space operating wavelength of the antenna.

20 Claims, 23 Drawing Sheets

Related U.S. Application Data continuation of application No. 14/733,311, filed on Jun. 8, 2015, now Pat. No. 9,761,948, which is a continuation of application No. 13/475,419, filed on May 18, 2012, now Pat. No. 9,077,073, which is a continuation of application No. 12/240,088, filed on Sep. 29, 2008, now Pat. No. 8,203,488, which is a continuation of application No. 11/488,107, filed on Jul. 17, 2006, now Pat. No. 7,463,199, which is a continuation of application No. 11/040,622, filed on Jan. 21, 2005, now Pat. No. 7,095,372, which is a continuation of application No. PCT/EP02/12427, filed on Nov. 7, 2002.

(51) Int. Cl.

| | | |
|---|---|---|
| *H01L 23/66* | (2006.01) | |
| *H01L 25/16* | (2006.01) | |
| *H01Q 1/22* | (2006.01) | |
| *H01Q 1/36* | (2006.01) | |
| *H01Q 1/38* | (2006.01) | |
| *H01Q 1/40* | (2006.01) | |
| *H01Q 9/26* | (2006.01) | |
| *H01Q 9/40* | (2006.01) | |
| *H01Q 9/42* | (2006.01) | |
| *H01Q 13/10* | (2006.01) | |
| *H01Q 9/30* | (2006.01) | |
| *H01L 23/00* | (2006.01) | |

(52) U.S. Cl.
CPC ............ *H01Q 1/2283* (2013.01); *H01Q 1/36* (2013.01); *H01Q 1/38* (2013.01); *H01Q 1/40* (2013.01); *H01Q 9/26* (2013.01); *H01Q 9/30* (2013.01); *H01Q 9/40* (2013.01); *H01Q 9/42* (2013.01); *H01Q 13/10* (2013.01); *H01L 24/48* (2013.01); *H01L 24/49* (2013.01); *H01L 24/73* (2013.01); *H01L 2223/6677* (2013.01); *H01L 2224/05599* (2013.01); *H01L 2224/16225* (2013.01); *H01L 2224/32225* (2013.01); *H01L 2224/45015* (2013.01); *H01L 2224/45099* (2013.01); *H01L 2224/48091* (2013.01); *H01L 2224/48227* (2013.01); *H01L 2224/48265* (2013.01); *H01L 2224/48464* (2013.01); *H01L 2224/49175* (2013.01); *H01L 2224/73265* (2013.01); *H01L 2224/85399* (2013.01); *H01L 2924/00* (2013.01); *H01L 2924/00012* (2013.01); *H01L 2924/00014* (2013.01); *H01L 2924/01004* (2013.01); *H01L 2924/01019* (2013.01); *H01L 2924/01078* (2013.01); *H01L 2924/09701* (2013.01); *H01L 2924/14* (2013.01); *H01L 2924/1423* (2013.01); *H01L 2924/15311* (2013.01); *H01L 2924/181* (2013.01); *H01L 2924/19041* (2013.01); *H01L 2924/207* (2013.01); *H01L 2924/3011* (2013.01); *H01L 2924/3025* (2013.01); *H01L 2924/30107* (2013.01); *H01L 2924/30111* (2013.01)

(56) References Cited

U.S. PATENT DOCUMENTS

| | | | |
|---|---|---|---|
| 4,038,662 A | 7/1977 | Turner | |
| 4,232,277 A | 11/1980 | Dickens | |
| 4,751,513 A | 6/1988 | Daryoush | |
| 4,843,468 A | 6/1989 | Drewery | |
| 5,272,485 A | 12/1993 | Mason et al. | |
| 5,363,114 A | 11/1994 | Shoemaker | |
| 5,386,214 A | 1/1995 | Sugawara | |
| 5,569,879 A | 10/1996 | Gloton | |
| 5,621,199 A | 4/1997 | Calari | |
| 5,621,913 A | 4/1997 | Tuttle | |
| 5,682,167 A | 10/1997 | Mullen | |
| 5,710,458 A | 1/1998 | Iwasaki | |
| 5,892,661 A | 4/1999 | Stafford | |
| 5,903,239 A | 5/1999 | Takahashi | |
| 6,011,518 A | 1/2000 | Yamagishi | |
| 6,052,093 A | 4/2000 | Yao | |
| 6,087,990 A | 7/2000 | Thill | |
| 6,107,920 A | 8/2000 | Eberhardt | |
| 6,147,655 A | 11/2000 | Roesner | |
| 6,211,825 B1 | 4/2001 | Deng | |
| 6,212,575 B1 | 4/2001 | Cleron | |
| 6,236,366 B1 | 5/2001 | Yamamoto | |
| 6,239,752 B1 | 5/2001 | Blanchard | |
| 6,240,301 B1 | 5/2001 | Phillips | |
| 6,263,193 B1 | 7/2001 | Iseki | |
| 6,268,796 B1 | 7/2001 | Gnadinger | |
| 6,281,848 B1 | 8/2001 | Nagumo | |
| 6,285,342 B1 | 9/2001 | Brady | |
| 6,320,543 B1 | 11/2001 | Ohata | |
| 6,366,260 B1 | 4/2002 | Curtis | |
| 6,373,447 B1 | 4/2002 | Rostoker | |
| 6,388,631 B1 | 5/2002 | Livingston | |
| 6,421,013 B1 | 7/2002 | Chung | |
| 6,424,315 B1 | 7/2002 | Glenn | |
| 6,465,880 B1 | 10/2002 | Dobashi | |
| 6,476,766 B1 | 11/2002 | Cohen | |
| 6,509,825 B1 | 1/2003 | Smit | |
| 6,512,482 B1 | 1/2003 | Nelson | |
| 6,563,463 B1 | 5/2003 | Saito | |
| 6,583,762 B2 | 6/2003 | Hamada | |
| 6,611,237 B2 | 8/2003 | Smith | |
| 6,646,609 B2 | 11/2003 | Yuasa | |
| 6,670,921 B2 | 12/2003 | Sievenpiper | |
| 6,674,409 B2 | 1/2004 | Chean | |
| 6,693,594 B2 | 2/2004 | Pankinaho | |
| 6,697,021 B2 | 2/2004 | Shi | |
| 6,710,744 B2 | 3/2004 | Morris | |
| 6,716,103 B1 | 4/2004 | Eck | |
| 6,717,494 B2 | 4/2004 | Kikuchi | |
| 6,720,866 B1 | 4/2004 | Sorrells | |
| 6,744,411 B1 | 6/2004 | Osterhues | |
| 6,745,945 B1 | 6/2004 | Limelette | |
| 6,819,293 B2 | 11/2004 | De Graauw | |
| 6,995,710 B2 | 2/2006 | Sugimoto | |
| 7,061,430 B2 | 6/2006 | Zheng | |
| 7,095,372 B2 | 8/2006 | Soler | |
| 7,148,850 B2 | 12/2006 | Puente | |
| 7,229,385 B2 | 6/2007 | Freeman | |
| 7,312,528 B2 | 12/2007 | Watanabe et al. | |
| 7,391,376 B2 | 6/2008 | Yeah | |
| 7,405,698 B2 | 7/2008 | De Rochemont | |
| 7,463,199 B2 | 12/2008 | Soler | |
| 7,502,074 B2 | 3/2009 | Narita | |
| 7,511,675 B2 | 3/2009 | Puente | |
| 7,791,539 B2 | 9/2010 | Soler | |
| 8,178,457 B2 | 5/2012 | De Rochemont | |
| 8,330,259 B2 * | 12/2012 | Soler Castany | H01Q 1/36 257/678 |
| 8,738,103 B2 * | 5/2014 | Puente Baliarda | H01Q 1/243 455/575.7 |
| 9,331,389 B2 | 5/2016 | Anguera Pros | |
| 9,761,948 B2 | 9/2017 | Soler Castany et al. | |
| 2001/0009507 A1 | 7/2001 | Washino | |
| 2001/0046126 A1 | 11/2001 | Colello | |
| 2001/0054755 A1 | 12/2001 | Kirkham | |
| 2002/0005433 A1 | 1/2002 | Nochi | |
| 2002/0016168 A1 | 2/2002 | Rousseau | |
| 2002/0033773 A1 | 3/2002 | Hiribayashi | |
| 2002/0058539 A1 | 5/2002 | Underbrink | |
| 2002/0094661 A1 | 7/2002 | Enquist | |
| 2002/0186168 A1 | 12/2002 | Cheah | |
| 2003/0025637 A1 | 2/2003 | Mendolia | |
| 2003/0102544 A1 | 6/2003 | Nishikawa | |
| 2003/0201942 A1 | 10/2003 | Poilasne | |
| 2004/0014428 A1 | 1/2004 | Franca-Neto | |
| 2004/0092236 A1 | 5/2004 | Irie et al. | |

(56) References Cited

U.S. PATENT DOCUMENTS

| | | |
|---|---|---|
| 2004/0119644 A1 | 6/2004 | Puente |
| 2004/0129785 A1 | 7/2004 | Luu |
| 2004/0129786 A1 | 7/2004 | Reignoux |
| 2004/0137971 A1 | 7/2004 | Shoji |
| 2004/0145521 A1 | 7/2004 | Hebron |
| 2005/0156787 A1 | 7/2005 | Myoung |
| 2014/0138546 A1 | 5/2014 | Luz et al. |

FOREIGN PATENT DOCUMENTS

| | | |
|---|---|---|
| EP | 0902472 | 3/1999 |
| EP | 0969375 | 1/2000 |
| EP | 0978729 | 2/2000 |
| EP | 1085597 | 3/2001 |
| EP | 1126522 | 8/2001 |
| EP | 1130677 | 9/2001 |
| EP | 1227540 | 7/2002 |
| EP | 1258054 | 11/2002 |
| EP | 1307078 | 5/2003 |
| EP | 1326302 | 11/2003 |
| ES | 2112163 | 3/1998 |
| FR | 2800245 | 10/1999 |
| JP | 62262502 | 11/1987 |
| JP | 01311605 | 12/1989 |
| JP | 04291502 | 10/1992 |
| JP | 05347507 | 12/1993 |
| JP | 07273685 | 10/1995 |
| JP | 08052968 | 2/1996 |
| JP | 8056113 | 2/1996 |
| JP | 09069718 | 3/1997 |
| JP | 9083240 | 3/1997 |
| JP | 09093029 | 4/1997 |
| JP | 9321529 | 12/1997 |
| JP | 10261914 | 9/1998 |
| JP | 11205024 | 7/1999 |
| JP | 2000278009 | 10/2000 |
| JP | 2001007639 | 1/2001 |
| JP | 2001292026 | 10/2001 |
| JP | 2001345745 | 12/2001 |
| JP | 2002050918 | 2/2002 |
| JP | 2002064329 | 2/2002 |
| JP | 2002141726 | 5/2002 |
| JP | 2002158529 | 5/2002 |
| JP | 2002190706 | 7/2002 |
| JP | 2002299933 | 10/2002 |
| JP | 2002299935 | 10/2002 |
| WO | 97/06578 | 2/1997 |
| WO | 99/27608 | 6/1999 |
| WO | 99/35691 | 7/1999 |
| WO | 99/56347 | 11/1999 |
| WO | 00/25266 | 5/2000 |
| WO | 00/34916 | 6/2000 |
| WO | 00/36700 | 6/2000 |
| WO | 00/77728 | 12/2000 |
| WO | 01/04957 | 1/2001 |
| WO | 01/05048 | 1/2001 |
| WO | 01/08093 | 2/2001 |
| WO | 01/22528 | 3/2001 |
| WO | 01/48861 | 7/2001 |
| WO | 01/54225 | 7/2001 |
| WO | 02/01495 | 1/2002 |
| WO | 02/29929 | 4/2002 |
| WO | 02/35646 | 5/2002 |
| WO | 02/060004 | 8/2002 |
| WO | 02/063714 | 8/2002 |
| WO | 02/095869 | 11/2002 |
| WO | 02/096166 | 11/2002 |
| WO | 03/050913 | 6/2003 |
| WO | 03/096475 | 11/2003 |
| WO | 2004/019261 | 3/2004 |
| WO | 2004/021271 | 3/2004 |
| WO | 2004/025778 | 3/2004 |
| WO | 2004/042868 | 5/2004 |
| WO | 2004/075342 | 9/2004 |

OTHER PUBLICATIONS

Balanis, C. A., Antenna Theory—Analysis and design—Chapter 4—Linear wire antennas, Hamilton Printing, Jan. 1, 1982.

Berizzi, F., Fractal analysis of the signal scattered from the sea surface, Antennas and Propagation, IEEE Transactions on, Feb. 1, 1999, vol. 47, No. 2.

Boshoff, H., A fast box counting algorithm for determining the fractal dimension of sampled continuous functions, IEEE, Jan. 1, 1992.

Carver, K. R. et al., Microstrip antenna technology, Antennas and Propagation, IEEE Transactions on, Jan. 1, 1981, vol. AP29, No. 1.

Caswell, W. E., Invisible errors in dimensions calculations: geometric and systematic effects, Dimensions and Entropies in Chaotic Systems, Jan. 1, 1986.

Cetiner, B. A. et al, Small size CPW-fed chip antenna for integration with RF / Wireless communication systems, Antennas and Propagation Society (APS), 2002. IEEE International Symposium, Jun. 16, 2002.

Cetiner, B. A. et al., A packaged miniature antenna for wireless networking, Microelectronic International Microelectronics and Packaging Society (IMAPS), 2001. International Symposium on, Jan. 1, 2001.

Chakraborty, S. et al, Development of an integrated bluetooth RF transceiver module using multi-layer system on package technology, Radio and Wireless (RAWCON), Boston, 2001. IEEE Conference, Aug. 19, 2001.

Chakraborty, S. et al., A 2.4-GHz radio front in RF system-on-package technology, Microwave Magazine, IEEE, Jun. 1, 2002.

Chen, S. et al., On the calculation of Fractal features from images, Pattern Analysis and Machine Intelligence, IEEE Transactions on, Oct. 1, 1993, vol. 15, No. 10.

Chu, L. J., Physical limitations of omni-directional antennas, Journal of Applied Physics, Dec. 1, 1948.

Davis, M. F. et al, RF-microwave multi-layer integrated passives using fully organic system on package (SOP) technology, Microwave Symposium Digest (MTT-S), 2001. IEEE International, May 20, 2001.

Desclos, L. et al., V-Band double-slot antenna integration on LTCC substrate using thick-film technology, Microwave and Optical Technology Letters, Mar. 5, 2001, vol. 28, No. 5.

Feng, J., Fractional box-counting approach to fractal dimension estimation, Pattern Recognition, 13th, 1996. International Conference on, Jan. 1, 1996.

Garg, R. et al., Microstrip antenna design handbook, Artech House, Jan. 1, 2001.

Griffin, D. W.; Parfitt, A. J., Electromagnetic design aspect of packages for monolithic microwave integrated circuit based arrays with integrated antenna elements, Antennas and Propagation, IEEE Transactions on, Sep. 1, 1995, vol. 43, No. 9.

Halbo, L.; Ohlckers, P., Electronic components, packaging and production, University of Oslo, Jan. 1, 1995.

Hall, P. S., System applications—the challenge for active integrated antennas, Antennas and Propagarion (AP2000), Davos, 2000. Millenium Conference on, Apr. 1, 2000.

Hansen, R. C., Fundamental limitations in antennas, Proceedings of the IEEE, Feb. 1, 1981, vol. 69, No. 2.

Harris, S. et al, Handset industry debates Bluetooth options, Wireless Europe, May 1, 2002.

Jayaraj, K. et al, A low cost multichip packaging technology for monolithic microwave integrated circuits, Antennas and Propagation, IEEE Transactions on, Sep. 1, 1995, vol. 43.

Johnson, R. C., Antenna engineering handbook—Table of contents, McGraw-Hill, Jan. 1, 1993.

Judd et al, Estimating dimensions with confidence, International journal of Bifurcation and Chaos, Feb. 1, 1991.

Kim, K., A plane wave model approach to understanding propagation in an intra-chip communication system, Antennas and Propagation Society (APS), 2001. IEEE International Symposium, May 1, 2001.

Kim, K. et al, Integrated dipole antennas on silicon substrates for intra-chip communication, Antennas and Propagation, IEEE Transactions on, Jan. 1, 1999.

(56) References Cited

OTHER PUBLICATIONS

Kobayashi K. Estimation of 3D fractal dimension of real electrical tree patterns, Properties and Applications of Dielectric Materials, 4th , 1994. International Conference on, Jul. 1, 1994.
Kraus , J. D., Antennas, McGraw-Hill Book Company, Jan. 1, 1988.
Laskar , J. et al, Development of integrated 3D radio front-end system-on-package (SOP), Gallium Arsenide Integrated Circuit, 23rd. 2001 Annual Technical Digest, Oct. 21, 2001.
Li , Q. et al, Microstrip-fed cavity-backed slot antennas, Microwave and Optical Technology Letters, May 20, 2002.
Lim , K. et al, RF-System-On-Package (SOP) for wireless communications, Microwave Magazine, IEEE, Mar. 1, 2002.
Matsushima et al, Electromagnetically coupled dielectric chip antenna, Antennas and Propagation, IEEE Transactions on, Jun. 1, 1998.
Midford , T. A. et al, The evolution of packages for monolithic microwave and millimeter-wave circuits, Antennas and Propagation, IEEE Transactions on, Sep. 1, 1995, vol. 43.
Munson , R., Antenna engineering Handbook—Chapter 7—Microstrip Antennas, Johnson , R. C.—McGraw-Hill—Third Edition, Jan. 1, 1993.
Na, Software—Box counting dimension [electronic], Sewanee—http://www.sewanee.edu/Physics/PHYSICS123/BOX%20COUNTING%20DIMENSION.html, Apr. 1, 2002.
Na, Chip scale package family, Amkor Technology, Jul. 5, 2000.
Na, RF/Wireless design services, Amkor Technology, Jun. 2, 2003.
Na, Bluetooth radio, Ericsson Microelectronics—www.palowireless.com/database/ericsson/pba31301r1e.pdf, Aug. 1, 2001.
Neary , D., Fractal methods in image analysis and coding, Dublin City University—www.redbrick.dcu.ie/*bolsh/thesis/node16.html and *node22.html, Jan. 22, 2001.
Ng , V., Diagnosis of melanoma with fractal dimesions, TENCON, 1993. IEEE Conference, Jan. 1, 1993.
Papapolymerou , I. ; Franklin , R. ; K. ; Katehi , L. P. B., Micromachined patch antennas, Antennas and Propagation, IEEE Transactions on, Feb. 1, 1998, vol. 46, No. 2.
Peitgen , H. O. ; Jürgens , H. ; Saupe , D., Chaos and fractals. New frontiers of science, Springer, Feb. 12, 1993.
Penn , A., Fractal dimension of low-resolution medical images, Engineering in Medicine and Biology Society (EMBS), 18th ,1996. IEEE Annual International Conference of the, Jan. 1, 1996.
Pinel , S. et al, 3D integrated LTCC module using BGA technology for compact C-band RF front-end module, Microwave Symposium Digest (MTT-S), 2002. IEEE International, Jun. 2, 2002.
Pozar , D. M. ; Schaubert , D. H., Microstrip antennas. The analysis and design of microstrip antennas and arrays, IEEE Press; Pozar, Schaubert, Jan. 1, 1995.
Rouvier , R. et al., Fractal analysis of bidimensional profiles and application to electromagnetic scattering from soils, IEEE, Jan. 1, 1996.
Russell , D. A. et al., Dimension of strange attractors, Physical Review, Oct. 6, 1980, vol. 45, No. 14.
Sarkar , N., An efficient differential box-counting approach to compute fractal dimension of image, Systems, Man and Cybernetics, 1994. IEEE International Conference on, Jan. 3, 1994, vol. 24, No. 1.
Sherwani , N., Introduction to multichip modules—Full, Wiley InterScience, Jan. 1, 1995.
Simons , R. N., Finite width coplanar waveguide patch antenna with vertical fed through interconnect, Antennas and Propagation Society (APS), 1996. IEEE International Symposium, Jul. 21, 1996, vol. 2.
U.S. Appl. No. 12/845,230—Office action dated Oct. 20, 2010, USPTO, Oct. 20, 2010.
U.S. Appl. No. 12/845,230—Response to office action dated Oct. 20, 2010, Kenyon & Kenyon, Feb. 18, 2011.
Singh , D. et al, Small H-shaped antennas for MMIC applications, Antennas and Propagation, IEEE Transactions on, Jul. 1, 2000.
So , P. et al, Box-counting dimension without boxes—Computing D0 from average expansion rates, Physical Review, Jul. 1, 1999, vol. 60, No. 1.
Song, C. T. P., Novel antenna design for future mobile systems, The University of Birmingham, May 1, 2001.
Tang , Y., The application of fractal analysis to feature extraction, IEEE, Jan. 1, 1999.
Tanidokoro , H. ; Konishi , N. et al, I-wavelength loop dielectric chip antennas, Antennas and Propagation, IEEE Transactions on, Jan. 1, 1998.
Tavakkol-Hamedani , F. et al, The effects of substrate and ground plane size on the performance of finite rectangular microstrip antennas, Antennas and Propagation Society (APS), 2002. IEEE International Symposium, Jun. 16, 2002.
Virga , K. L., Low-profile enhanced-bandwidth PIFA antennas for wireless communications packaging, Microwave Theory and Techniques, IEEE Transactions on, Oct. 10, 1997, vol. 45.
Wheeler , H. A., Fundamental limitations of small antennas, Proceedings of the IRE, Jan. 1, 1947.
Zang , Y. P. et al, Integration of a planar inverted F antenna on a cavity down ceramic ball grid array package, Antennas and Propagation, IEEE Transactions on, Jun. 1, 2002.
Zhang , Y. P. et al., Cofired laminated ceramic package antenna for single-chip wireless transceivers, Microwave and Optical Technology Letters, Apr. 1, 2002, vol. 33, No. 1.
Zhao , J. et al, Design of chip-scale patch antennas for 5-6 GHz wireless microsystems, Antennas and Propagation Society (APS), 2001. IEEE International Symposium, Jul. 1, 2001.
Document 0190—Defendant HTC Corporation's First amended answer and counterclaim to plaintiff's amended complaint, Defendants, Oct. 2, 2009.
Expert report of Dwight L. Jaggard (redacted)—expert witness retained by Fractus, Fractus, Feb. 23, 2011.
Rebuttal expert report of Dr. Dwight L. Jaggard (redacted version), Fractus, Feb. 16, 2011.
Rebuttal expert report of Dr. Stuart A. Long (redacted version), Fractus, Feb. 16, 2011.
EP00909089—Minutes from Oral Proceedings, EPO, Jan. 28, 2005.
EP00909089—Office Action dated Feb. 7, 2003, EPO, Feb. 7, 2003.
EP00909089—Response to Office Action dated on Feb. 7, 2003, Herrero & Asociados, Aug. 14, 2003.
EP00909089—Summons to attend oral proceedings, EPO, Oct. 28, 2004.
EP00909089—Written submissions, Herrero & Asociados, Dec. 15, 2004.
PCT/EP00/00411—International preliminary examination report dated Aug. 29, 2002—Notification concerning documents transmitted, EPO, Aug. 29, 2002.
U.S. Appl. No. 10/422,578—Office Action dated Apr. 7, 2005, USPTO, Apr. 7, 2005.
U.S. Appl. No. 10/422,578—Office Action dated Aug. 23, 2007, USPTO, Aug. 23, 2007.
U.S. Appl. No. 10/422,578—Office Action dated Aug. 24, 2005, USPTO, Aug. 24, 2005.
U.S. Appl. No. 10/422,578—Office Action dated Jan. 26, 2006, USPTO, Jan. 26, 2006.
U.S. Appl. No. 10/422,578—Office Action dated Mar. 12, 2007, USPTO, Mar. 12, 2007.
U.S. Appl. No. 10/422,578—Office Action dated Mar. 26, 2008, USPTO, Mar. 26, 2008.
U.S. Appl. No. 10/422,578—Office Action dated Oct. 4, 2004, USPTO, Oct. 4, 2004.
U.S. Appl. No. 11/040,622—Notice of Allowance dated Mar. 30, 2006, USPTO, Mar. 30, 2006.
U.S. Appl. No. 11/040,622—Office Action dated Feb. 16, 2006, USPTO, Feb. 16, 2006.
U.S. Appl. No. 11/040,622—Response to the Office Action dated Feb. 16, 2006, Jones Day, Mar. 9, 2006.
U.S. Appl. No. 11/488,107—Notice of Allowance dated Jul. 22, 2008, USPTO, Jul. 22, 2008.
U.S. Appl. No. 11/488,107—Office Action dated Dec. 20, 2007, USPTO, Dec. 20, 2007.
U.S. Appl. No. 11/488,107—Response to the Office Action dated Dec. 20, 2007, Kenyon & Kenyon, Mar. 4, 2008.
U.S. Appl. No. 11/556,455—Notice of Allowance dated May 4, 2010, USPTO, May 4, 2010.

(56) References Cited

OTHER PUBLICATIONS

U.S. Appl. No. 11/556,455—Office Action dated Dec. 16, 2009, USPTO, Dec. 16, 2009.

U.S. Appl. No. 11/556,455—Response to the office action dated Dec. 16, 2009, Kenyon & Kenyon, Mar. 16, 2010.

U.S. Appl. No. 12/240,088—Advisory action before filing of an appeal brief in response to final office action dated Jan. 11, 2011, USPTO, Mar. 11, 2011.

U.S. Appl. No. 12/240,088—Notice of allowance dated Feb. 1, 2012, USPTO, Feb. 1, 2012.

U.S. Appl. No. 12/240,088—Notice of allowance dated Mar. 5, 2012, USPTO, Mar. 5, 2012.

U.S. Appl. No. 12/240,088—Office action dated Jan. 11, 2011, USPTO, Jan. 11, 2011.

U.S. Appl. No. 12/240,088—Office action dated Jun. 22, 2010, USPTO, Jun. 22, 2010.

U.S. Appl. No. 12/240,088—Response to final office action dated Jan. 11, 2011 and the advisory action dated Mar. 16, 2011, Kenyon & Kenyon, Jul. 11, 2011.

U.S. Appl. No. 12/240,088—Response to office action dated Jan. 11, 2011, Kenyon & Kenyon, Mar. 11, 2011.

U.S. Appl. No. 12/240,088—Response to office action dated Jun. 22, 2010, Kenyon & Kenyon, Nov. 9, 2010.

U.S. Appl. No. 12/240,088—Supplemental response to final office action dated Mar. 11, 2011, Kenyon & Kenyon, Mar. 17, 2011.

U.S. Appl. No. 12/845,230—Amendment and Request for continued examination dated Apr. 25, 2011, Kenyon & Kenyon, Sep. 26, 2011.

U.S. Appl. No. 12/845,230—Notice of Allowance dated Jan. 4, 2013, USPTO, Jan. 4, 2013.

U.S. Appl. No. 12/845,230—Office action dated Apr. 25, 2011, USPTO, Apr. 25, 2011.

U.S. Appl. No. 12/845,230—Office action dated Feb. 9, 2012, USPTO, Feb. 9, 2012.

\* cited by examiner

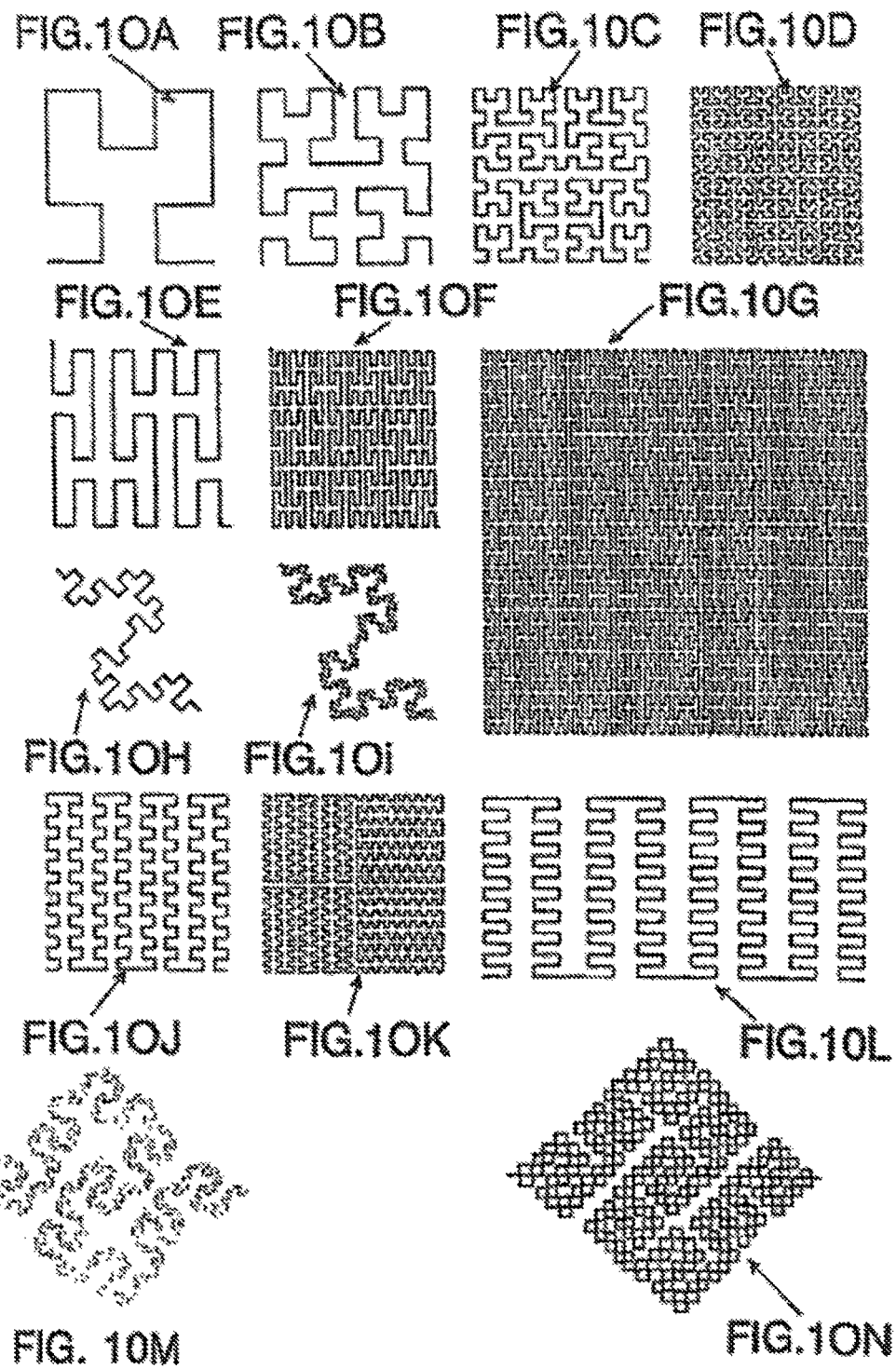
PRIOR ART

INTEGRATED CIRCUIT PACKAGE INCLUDING MINIATURE ANTENNA

CROSS REFERENCE TO RELATED APPLICATIONS

This application is a continuation of U.S. patent application Ser. No. 15/673,164 filed Aug. 9, 2017, which is a continuation of U.S. patent application Ser. No. 14/733,311 filed Jun. 8, 2015, issued as U.S. Pat. No. 9,761,948, on Sep. 12, 2017, which is a continuation of U.S. patent application Ser. No. 13/475,419 filed May 18, 2012, issued as U.S. Pat. No. 9,077,073, on Jul. 7, 2015, which is a continuation of U.S. patent application Ser. No. 12/240,088 filed Sep. 29, 2008, issued as U.S. Pat. No. 8,203,488, on Jun. 19, 2012, which is a continuation of U.S. patent application Ser. No. 11/488,107 filed Jul. 17, 2006, issued as U.S. Pat. No. 7,463,199, on Dec. 9, 2008, which is a continuation of U.S. patent application Ser. No. 11/040,622 filed Jan. 21, 2005, issued as U.S. Pat. No. 7,095,372, on Aug. 22, 2006, which is a continuation of International Patent Application No. PCT/EP2002/012427 filed Nov. 7, 2002, the entire contents of which are hereby incorporated by reference.

BACKGROUND

The present invention relates generally to novel integrated circuit packages that include a new family of miniature antennas in the package. The present invention allows the integration of a full wireless system into a single component.

There is a trend in the semiconductor industry towards the so-called System on Chip (SoC) and System on Package (SoP) concepts. This means integrating as many components of an electronic system as possible (processors, memories, logic gates, biasing circuitry, etc.) into a single semiconductor chip (or "die") (SoC) or at least into a single integrated circuit package (SoP). The full integration of systems or subsystems into a single chip or package provides many advantages in terms of cost, size, weight, consumption, performance and product design complexity. Several electronics components for consumer applications, such as handsets, wireless devices, personal digital assistants (PDA) or personal computers are becoming more and more integrated into SoP/SoC products.

The concept of integrating a full wireless system into a SoC/SoP device (FWSoC and FWSoP) is especially attractive owing to the tremendous growth and success of cellular and wireless systems. In particular, there is a new generation of short/medium range wireless applications such as Bluetooth™, Hyperlan, IEEE802.11 and ultra wide band (UWB) systems where the progressive system integration into a single, compact product is becoming a key success factor (see for instance S. Harris and H. Johnston, "Handset industry debate Bluetooth chip options", WirlessEurope, May 2002). Recently, several vendors (for example www.infineon.com, www.st.com, www.epson.com, www.csr.com) are offering SoC or SoP products for applications that integrate everything into the chip or package, except for the antenna. The reason the antenna is excluded is that its integration into the SoC or SoP is a major engineering challenge in the product development, mainly due to the reduced size of the commercial SoP and SoC packages and the well-known constraints on the performance of miniature antennas.

There have been reported several attempts to integrate an antenna inside a semiconductor die or chip, which die or chip also includes an electronic system or radio frequency (RF) front-end (see for example D. Singh, C. Kaliakis, P. Gardner, P. S. Hall, *Small H-Shaped Antennas for MMIC Applications*, IEEE Trans. on Antennas and Propagation, vol. 48, no. 7, July 2000; D. W. Griffin, A. J. Partfitt, *Electromagnetic Design Aspects of Packages for Monolithic Microwave Integrated Circuit-Based Arrays with Integrated Antenna Elements*, IEEE Trans. on Antennas and Propagation, vol. 43, no. 9 Sep. 1995; P. S. Hall, *System Applications: The Challenge for Active Integrated Antennas*, APS2000 Millennium Conference, April 2002; I. Papapolymerou, R. F. Drayton, L. P. B. Katehi, *Micromachined Patch Antennas*, IEEE Trans. on Antennas and Propagation, vol. 46, no. 2 Feb. 1998; J. Zhao, S. Raman, *Design of Chip-Scale Patch Antennas for 5-6 GHz Wireless Microsystem*, Antennas and Propagation Society, 2001 IEEE International Symp., Volume: 2, 2001; and U.S. Pat. No. 6,373,447). These designs feature two important limitations: first the operating frequency must be large enough to allow a conventional antenna to fit inside the chip; second the antenna performance is poor in terms of gain, mainly due to the losses in the semiconductor material. According to D. Singh, et al., the smallest frequency in which an antenna has been integrated together with an electronic system inside the same was 5.98 GHz. Typical gains that have been achieved with such designs are around −10 dBi.

In general, there is a trade-off between antenna performance and miniaturization. The fundamental limits on small antennas were theoretically established by H. Wheeler and L. J. Chu in the middle 1940's. They stated that a small antenna has a high quality factor (Q) because of the large reactive energy stored in the antenna vicinity compared to the radiated power. Such a high quality factor yields a narrow bandwidth; in fact, the fundamental derived in such theory imposes a maximum bandwidth given a specific size of a small antenna. Related to this phenomenon, it is also known that a small antenna features a large input reactance (either capacitive or inductive) that usually has to be compensated with an external matching/loading circuit or structure. It also means that it is difficult to pack a resonant antenna into a space which is small in terms of the wavelength at resonance. Other characteristics of a small antenna are its small radiating resistance and its low efficiency (see R. C. Hansen, *Fundamental Limitations* on Antennas, Proc. IEEE, vol. 69, no. 2, February 1981).

Some antenna miniaturization techniques rely basically on the antenna geometry to achieve a substantial resonant frequency reduction while keeping efficient radiation. For instance patent WO01/54225 discloses a set of space-filling antenna geometries (SFC) that are suitable for this purpose. Another advantage of such SFC geometries is that in some cases they feature a multiband response.

The dimension (D) is a commonly used parameter to mathematically describe the complexity of some convoluted curves. There exist many different mathematical definitions of dimension but in the present document the box-counting dimension (which is well-known to those skilled in advanced mathematics theory) is used to characterize some embodiments (see discussion on the mathematical concept of dimension in for instance W. E. Caswell and J. A. Yorke, *Invisible errors in dimension calculations: geometric and systematic effects*, Dimensions and Entropies in Chaotic Systems, G. Mayer-Kress edit, Springer-Verlag, Berlin 1989, second edition pp. 123-136, and K. Judd, A. I. Mees, *Estimating dimensions with confidence*, International Journal of Bifurcation and Chaos 1, 2 (1991) 467-470).

It should be apparent that the present invention is substantially different from some prior-art designs called chip-antennas (see for instance H. Tanidokoro, N. Konishi, E. Hirose, Y. Shinohara, H. Arai, N. Goto, 1-*Wavelength Loop Type Dielectric Chip Antennas*, Antennas and Propagation Society International Symposium, 1998, IEEE, vol. 4, 1998; *Electromagnetically coupled dielectric chip antenna*, Matsushima, H.; Hirose, E.; Shinohara, Y.; Arai, H.; Golo, N. Antennas and Propagation Society International Symposium, IEEE, Vol. 4, 1998). Those are typically single component antenna products that integrate only the antenna inside a surface-mount device. To achieve the necessary wavelength compression, those antennas are mainly constructed using high permittivity materials such as ceramics. The drawbacks of using such high permittivity materials are that the antenna has a very narrow bandwidth, the material introduces significant losses, and the manufacturing procedure and materials are not compatible with most current chip or package manufacturing techniques; therefore they do not currently include other components or electronics besides the antenna, and they are not suitable for a FWSoC or FWSoP. On the contrary, the present invention relies on the specific novel design of the antenna geometry and its ability to use the materials that are currently being used for integrated circuit package construction, so that the cost is minimized while allowing a smooth integration with the rest of the system.

There have been recently disclosed some RF SoP configurations that also include also antennas on the package. Again, most of these designs rely on a conventional microstrip, shorted patch or PIFA antenna that is suitable for large frequencies (and therefore small wavelengths) and feature a reduced gain. In the paper K. Lim, S. Pinel, M. Davis, A. Sutono, C. Lee, D. Heo, A. Obatoynbo, J. Laskar, E. Tantzeris. R. Tummala, *RF-System-On-Package (SOP) for Wireless Communications*, IEEE Microwave Magazine, vol. 3, no. 1, March 2002, a SoP including an RF front-end with an integrated antenna is described. The antenna comprises a microstrip patch backed by a cavity which is made with shorting pins and operates at 5.8 GHz. As mentioned in the paper, it is difficult to extend those designs in the 1-6 GHz frequency range where most current wireless and cellular services are located, mainly due to the size of conventional antennas at such large wavelengths. Another design for an antenna on a package is disclosed in Y. P. Zhang, W. B. Li, *Integration of a Planar Inverted F Antenna on a Cavity-Down Ceramic Ball Grid Array Package*, IEEE Symp. on Antennas and Propagation, June 2002. Although the antenna operates at the Bluetooth™ band (2.4 GHz), the IC package is substantially large (15×15 mm) and the antenna performance is poor (gain is below −9 dBi).

Patent application EP1126522 describes a particular double S-shaped antenna design that is mounted on a BGA package. Although no precise data is given on the package size in the application, typically, S-shaped slot antennas resonate at a wavelength on the order of twice the unfolded length of the S-shaped pattern. Again, this makes the whole package too large for typical wireless applications where the wavelength is above 120 mm. Also, this design requires a combination with high permittivity materials that, in turn, reduce the antenna bandwidth, increase its cost and decreases the overall antenna efficiency.

Regarding the package construction and architecture, there are several standard configurations depending mainly on the application. Some basic architectures are: single-in-line (SIL), dual-in-line (DIL), dual-in-line with surface mount technology DIL-SMT, quad-flat-package (QFP), pin grid array (PGA) and ball grid array (BGA) and small outline packages. Other derivatives are for instance: plastic ball grid array (PBGA), ceramic ball grid array (CBGA), tape ball grid array (TBGA), super ball grid array (SBGA), micro ball grid array □BGA®. Some of these configurations are present in their CSP (Chip Scale Package) versions, wherein the semiconductor chip or die typically fills up to an 85% of the package area. The interconnection of those packages with the semiconductor chip or die can be done with several standard processes and technologies as well, mainly wire-bonding, tape automated bonding and flip-chip. A description of several standard packaging architectures can be found in the websites of several package manufacturers, such as for instance www.amkor.com (see also L. Halbo, P. Ohlckers, *Electronic Components, Packaging and Production*, ISBN.82-992193-2-9).

In the last few years, several improvements in packaging technology have appeared mainly due to the development of Multichip Module (MCM) applications (see for instance N. Sherwani, Q. Yu, S. Badida, *Introduction to Multi Chip Modules*, John Wiley & Sons, 1995). Those consist of an integrated circuit package that typically contains several chips (i.e., several semiconductor dies) and discrete miniature components (biasing capacitors, resistors, inductors). Depending on the materials and manufacturing technologies, MCM packages are classified in three main categories: laminated (MCM-L), ceramic (MCM-C) and deposited (MCM-D). Some combinations of them are also possible, such as MCM-L/D and other derivations such as Matsushita ALIVH. These MCM packaging techniques cover a wide range of materials for the substrate (for instance E-glass/epoxy, E-glass/polyimide, woven Kevlar/epoxy, s-glass/cyanate ester, quartz/polymide, thermount/HiTa epoxy, thermount/polyimide, thermount/cyanate ester, PTFE, RT-Duroid 5880, Rogers RO3000® and RO4000®, polyiolefin, alumina, sapphire, quartz glass, Corning glass, beryllium oxide and even intrinsic GaAs and silicon) and manufacturing processes (thick film, thin film, silicon thin film, polymer thin film, LTCC, HTCC).

SUMMARY

The present invention relates generally to novel integrated circuit packages that include a new family of miniature antennas in the package. Also, the invention relates to several novel ways of arranging the materials and components of the package to include the antenna. The characteristic aspects of the invention are:
the small size of the antenna, which allows the use of very small packages (such as for instance CSP packages) at typical wireless wavelengths;
the antenna geometry that enables such a miniaturization;
the arrangement of the antenna in the package, and
the compatibility of the antenna design with virtually any state of the art packaging architecture.

The integrated circuit package of the present invention generally comprises an antenna in the form of a conducting pattern integrated in the package. One of the characteristic aspects of the invention is the geometry of the conducting pattern. The conducting pattern comprises a curve having at least five sections or segments, at least three of the sections or segments being shorter than one-tenth of the longest free-space operating wavelength of the antenna, each of the five sections or segments forming a pair of angles with each adjacent segment or section, wherein the smaller angle of each of the four pairs of angles between sections or segments is less than 180° (i.e., no pair of sections or segments define a longer straight segment), wherein at least two of the angles are less than 115°, wherein at least two of the angles are not equal, and wherein the curve fits inside a rectangular area the longest edge of which is shorter than one-fifth of the longest free-space operating wavelength of the antenna. In some embodiments, the curve is arranged such that two of the angles are defined respectively in the clockwise and counter-clockwise directions at opposite sides of the curve to minimize the inductive coiling effect.

In some embodiments, SFC geometries can be used to shape a portion of the antenna included in the package, as long as the antenna geometry is arranged within the package according to the present invention. Although SFC geometries as described in WO01/54225 provide significant miniaturization capabilities, they have some drawbacks in terms of efficiency and input impedance that need to be corrected by using the special package and antenna geometry arrangements as disclosed in the present invention. In many cases, SFC antenna geometries described in WO01/54225 by themselves do not meet the optimum trade-off between antenna miniaturization and performance because of an excess of a number of segments, because there is a too tight requirement on the size of the segments (some times breaking the antenna geometry in 10 segments reduces the antenna efficiency), and because the angles between segments need to be arranged according to the present invention (at least two angles less than 115°, but it is not always necessary for all of them to be less than 115°) to fit and operate inside the package.

For those packages where the size is critical and the required degree of miniaturization is very high, the characteristic curve of the antenna will feature a box-counting dimension larger than 1.17. For a further degree of miniaturization, the curve will be arranged such that its box-counting dimension ranges from 1.5 up to 3. For some embodiments, a curve having a box-counting dimension of about 2 is preferred.

The present invention applies to several antenna topologies, both balanced and unbalanced. In particular, monopoles, dipoles, loops, folded and loaded monopoles and dipoles and their slot or aperture equivalents (slot monopoles, slot dipoles, slot loops, folded and loaded slot monopoles and dipoles) are some of the structures that can be arranged according to the present invention. Other structures include shorted and bent monopoles (L monopoles, IFA), multibranch structures, coupled monopoles and dipole antennas and again their aperture equivalents. All of them would include the characteristic pattern built on a component of the integrated circuit package according to the present invention.

Another possible antenna configuration is a microstrip or patch antenna, including their shorted versions (shorted patches and planar inverted F or PIFA structures); nevertheless for the planar cases a particular selection of the disclosed geometries should be considered to achieve the required degree of miniaturization. In particular, the characteristic pattern of the invention should include at least a curve with fifteen segments, with at least seven of the segments being shorter than one-twentieth of the longest free-space operating wavelength of the antenna. The rest of the general conditions that conform the essential geometric aspects of the invention, as described above, apply to the microstrip patch and their shorted versions as well.

The present invention is compatible with any of the current integrated and integrated circuit package manufacturing techniques and architectures. For instance, tape bonding or flip-chip techniques could be used instead of wire bonding to interconnect the chip to the package. Also, a wide range of low-loss dielectric materials and single-layer or multi-layer manufacturing techniques such as the typical ones used in MCM-L, MCM-C and MCM-D or D/L techniques (for instance HTCC, LTCC, lamination, thin and thick film processes) can be combined with the newly disclosed antenna geometry and package arrangements to implement the invention. Analogously, the invention is compatible with MCM electronic architectures that include two or more semiconductor chips inside a single package. The MCM packaging architectures are typical for the development of SoP solutions, and for instance other RF passive and active components can be mounted on the package apart from the semiconductor dice. This means that in some embodiments of the invention, the antenna will not be directly connected to the semiconductor die as in the example of FIG. 1, but through an RF front-end (including for instance filtering, biasing, mixing and amplifying stages) or other passive elements (transmission lines, baluns, matching networks and so on) mounted on the package.

The above description relates the main aspects of the invention that contribute to the antenna miniaturization and its efficient integration on an integrated circuit package. It should be noted that not every folded structure would provide the desired degree of antenna miniaturization; packing a large length of wire or conducting material in any arrangement will not provide always an efficient behavior of the antenna, due to coupling between segments and bends, and due to an inefficient use of the available space. The present invention provides the necessary degree of compactness to achieve the desired degree of integration of the antenna into the integrated circuit package.

Of course, depending on the application (for instance cellular GSM, DCS or PCS, Bluetooth, WLAN, IEEE802.11a, IEEE802.11b, Hyperlan, Hyperlan2, UMTS, AMPS, WCDMA, DECT, UWB, CDMA-800, PDC-800, PDC-1500, KPCS, wireless chip interconnection, GPS, etc.), the requirements on the antenna in terms of bandwidth, impedance, efficiency, size and packaging density will be different. For every application there will be a trade-off on several of those parameters, and those trade-offs can always be met according to the essence and spirit of the present invention.

BRIEF DESCRIPTION OF THE DRAWINGS

FIGS. 10A-10N show examples of prior art space-filling curves suitable for use in the integrated circuit packages of the present invention.

DETAILED DESCRIPTION

Figure 1:
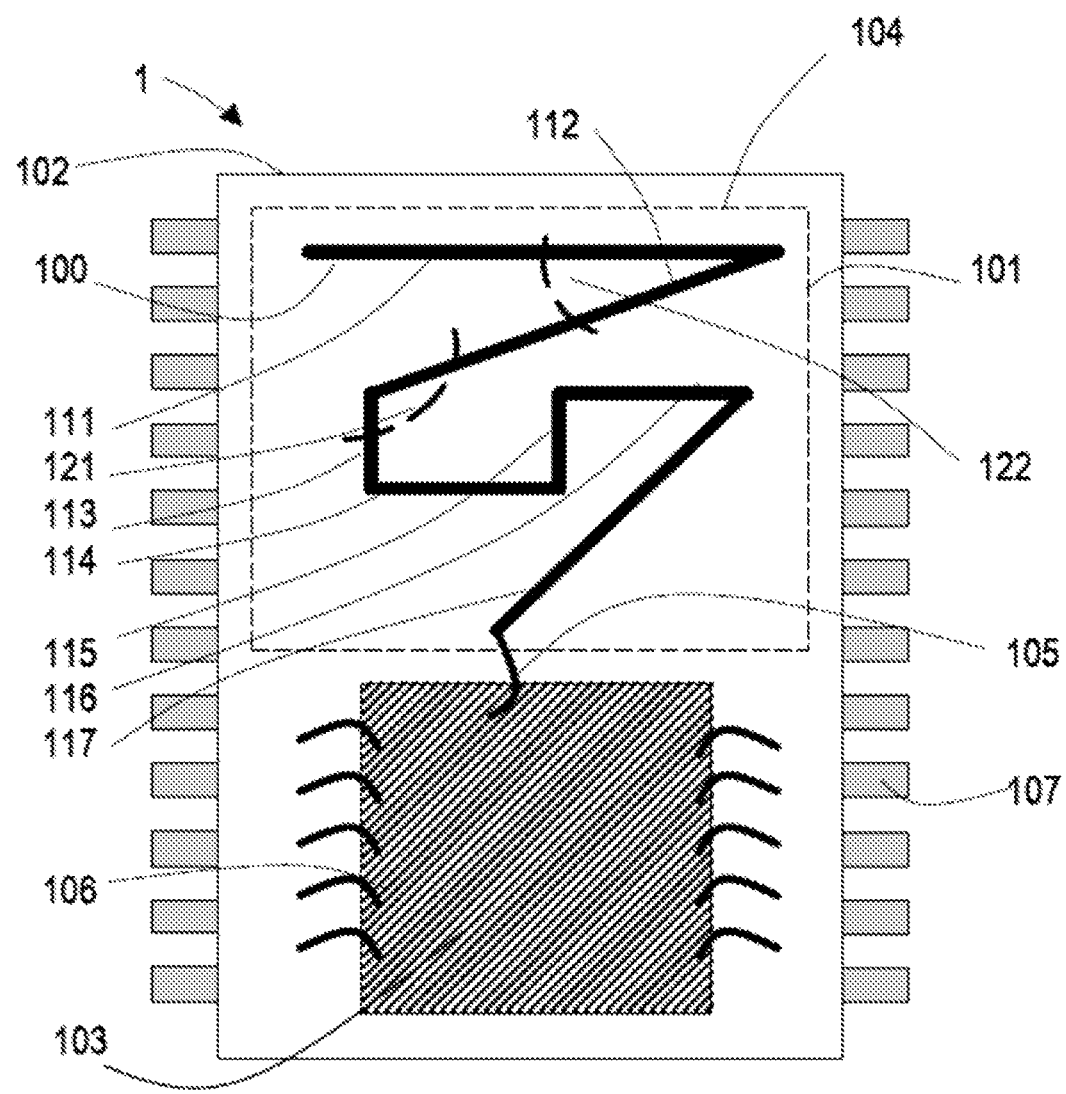
FIG. 1 shows an embodiment of an integrated circuit package including an antenna formed from a conducting pattern having seven segments, according to the present invention.

The present invention relates to an integrated circuit package comprising at least one substrate, each substrate including at least one layer, at least one semiconductor die, at least one terminal, and an antenna located in the integrated circuit package, but not on the at least one semiconductor die. The antenna comprises a conducting pattern, at least a portion of which includes a curve, and the curve comprises at least five segments, each of the at least five segments forming an angle with each adjacent segment in the curve, at least three of the segments being shorter than one-tenth of the longest free-space operating wavelength of the antenna. Each angle between adjacent segments is less than 180° and at least two of the angles between adjacent sections are less than 115°, and wherein at least two of the angles are not equal. The curve fits inside a rectangular area, the longest side of the rectangular area being shorter than one-fifth of the longest free-space operating wavelength of the antenna.

One of the advantages of the package arrangements of the present invention is that they allow a high package density including the antenna. In some embodiments such as for instance those shown in FIGS. 19A-19B and 21A-21B, the antenna can be fitted in a rectangular area, the longest edge of which is shorter than one-twentieth of the longest free-space operating wavelength of the antenna. In some cases such as the one shown in FIGS. 21A-21B, the arrangement of the package in terms of layout, antenna and chip arrangement allows the whole package to be smaller than one-twentieth of the free-space operating wavelength.

One aspect of the present invention is the box-counting dimension of the curve that forms at least a portion of the antenna. For a given geometry lying on a surface, the box-counting dimension is computed in the following way: first a grid with boxes of size L1 is placed over the geometry, such that the grid completely covers the geometry, and the number of boxes N1 that include at least a point of the geometry are counted; secondly a grid with boxes of size L2 (L2 being smaller than L1) is also placed over the geometry, such that the grid completely covers the geometry, and the number of boxes N2 that include at least a point of the geometry are counted again. The box-counting dimension D is then computed as:

$$D = -\frac{\log(N2) - \log(N1)}{\log(L2) - \log(L1)}$$

In terms of the present invention, the box-counting dimension is computed by placing the first and second grids inside the minimum rectangular area enclosing the curve of the antenna and applying the above algorithm.

The first grid should be chosen such that the rectangular area is meshed in an array of at least 5×5 boxes or cells, and the second grid is chosen such that L2=½ L and such that the second grid includes at least 10×10 boxes. By the minimum rectangular area it will be understood such area wherein there is not an entire row or column on the perimeter of the grid that does not contain any piece of the curve. Thus, some of the embodiments of the present invention will feature a box-counting dimension larger than 1.17, and in those applications where the required degree of miniaturization is higher, the designs will feature a box-counting dimension ranging from 1.5 up to 3, inclusive. For some embodiments, a curve having a box-counting dimension of about 2 is preferred. For very small antennas, that fit for example in a rectangle of maximum size equal to one-twentieth of the longest free-space operating wavelength of the antenna, the box-counting dimension will be necessarily computed with a finer grid. In those cases, the first grid will be taken as a mesh of 10×10 equal cells, while the second grid will be taken as a mesh of 20×20 equal cells, and then D is computed according to the equation above. In the case of small packages with of planar designs, i.e., designs where the antenna is arranged in a single layer on a package substrate, it is preferred that the dimension of the curve included in the antenna geometry have a value close to D=2.

In general, for a given resonant frequency of the antenna, the larger the box-counting dimension the higher the degree of miniaturization that will be achieved by the antenna. One way of enhancing the miniaturization capabilities of the antenna according to the present invention is to arrange the several segments of the curve of the antenna pattern in such a way that the curve intersects at least one point of at least 14 boxes of the first grid with 5×5 boxes or cells enclosing the curve. Also, in other embodiments where a high degree of miniaturization is required, the curve crosses at least one of the boxes twice within the 5×5 grid, that is, the curve includes two non-adjacent portions inside at least one of the cells or boxes of the grid.

Figure 23A:
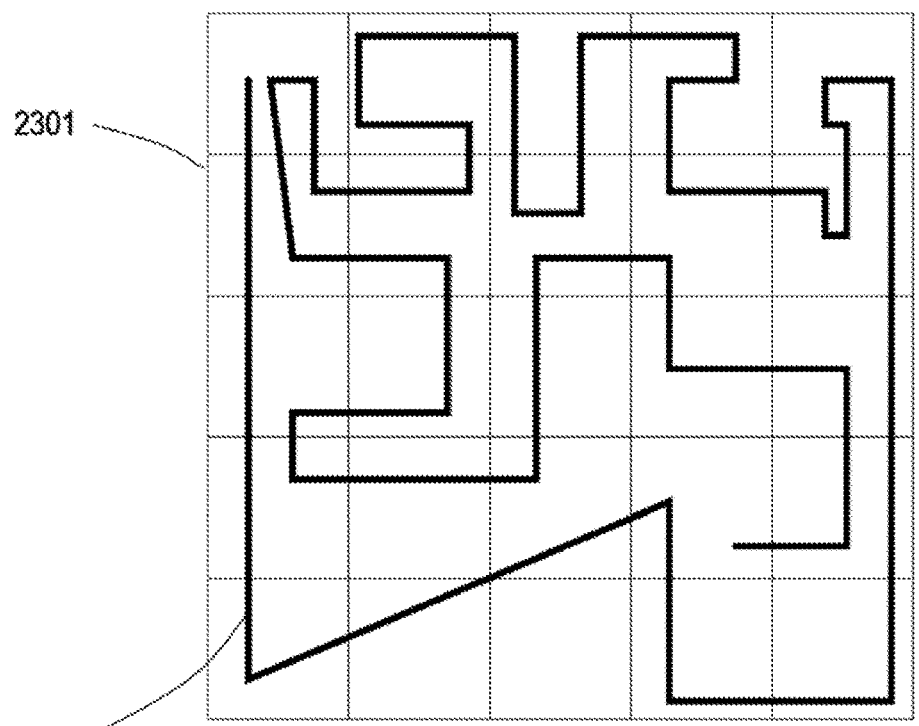
FIGS. 23A and 23B show examples of how the box-counting dimension is calculated, according to the present invention.
Figure 23B:
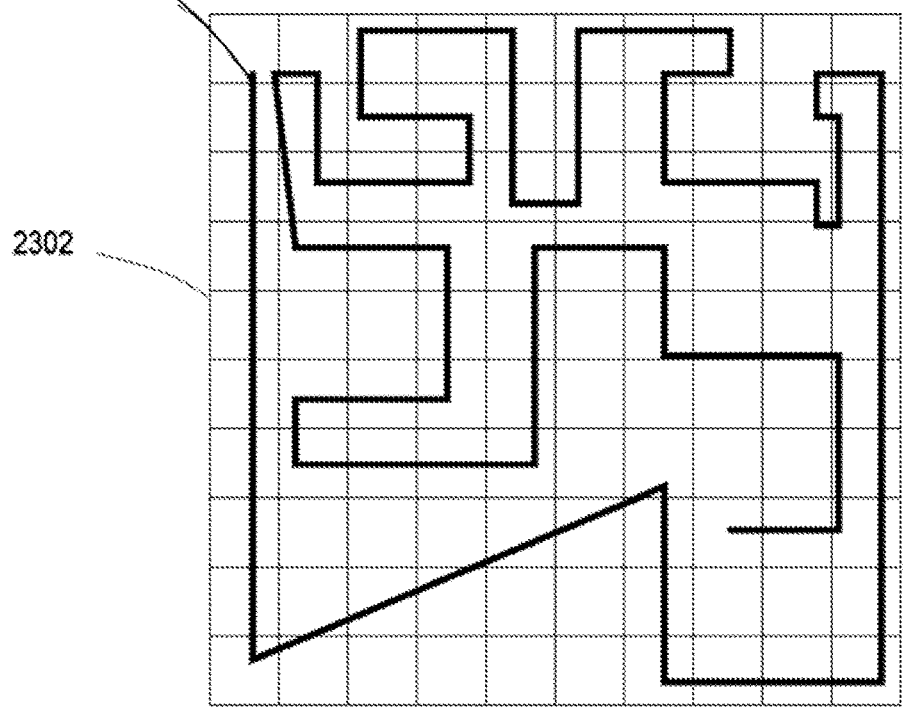

An example of how the box-counting dimension is computed according to the present invention is shown in FIGS. 23A and 23B. An example of a curve 2300 according to the present invention is placed under a 5×5 grid 2301 and under a 10×10 grid 2302. As seen in the graph, the curve 2300 touches N1=25 boxes in grid 2301 while it touches N2=78 boxes in grid 2302. In this case the size of the boxes in grid 2301 is twice the size of the boxes in 2302. By applying the equation above it is found that the box-counting dimension of curve 2302 is, according to the present invention, equal to D=1.6415. This example also meets some other characteristic aspects of some preferred embodiments within the present invention. The curve 2300 crosses more than 14 of the 25 boxes in grid 2301, and also the curve crosses at least one box twice, that is, at least one box contains two non adjacent segments of the curve. In fact, 2300 is an example where such a double crossing occurs in 13 boxes out of the 25 in 2301.

The package arrangements in which the antenna is built on a single layer of a package substrate are very convenient in terms of cost because a single mask can be used for processing the antenna pattern on such a layer. In some embodiments (such as for instance those shown in FIGS. 1, 2, 4, 5, 18A-18B, 19A-19B, 20A-20B, and 21A-21B) the antenna is arranged in a single layer and fed in one tip of the curve, such that no conductor crossing over the curve is required. Although not required, a further simplification and cost reduction is achieved by means of those embodiments in the present invention wherein the antenna and the chip are mounted on the same layer of a package substrate.

It is noted that, according to the present invention, the antenna structure is not limited to a planar structure, because the package can include several portions or parts of the antenna in multiple layers or components of the package. The layers can be optionally interconnected by means of several vias and viaholes. A preferred arrangement in several embodiments comprises repeating a similar antenna pattern on two or more layers within at least one of the package substrates, and interconnect such similar conducting patterns for the antenna at one or more points. Typically a preferred point for interconnecting such similar layers will be the feeding point. This way the current splits symmetrically on every layer so that the ohmic resistance of the overall antenna is lower and the antenna is more efficient. A simple, low-cost version of such an arrangement comprises a package including a single substrate, the substrate including a conducting antenna pattern at both sides, the patterns being connected by at least one via.

In other embodiments, two or more conducting patterns for the antenna structure are located on two or more layers of the package substrate, but those patterns are different. At least one of the patterns includes the curve of the present invention with at least five segments, while the conducting pattern or patterns in the other layer or layers are used to modify the antenna impedance and impedance bandwidth, the antenna resonant frequency, the radiation pattern, or a combination of those antenna parameters at the same time.

Other embodiments where the antenna structure is split on several parallel layers consists on an active-parasitic arrangement. That is, the package includes a plurality of dielectric layers within one or more substrates of the package, wherein the package includes at least a first conducting pattern for the antenna in a first of the layers, the first conducting pattern on the first layer being coupled or connected to the semiconductor die. Such a first conducting pattern that is fed by the die is the active element of the antenna arrangement. In this arrangement, the package includes at least a second conducting pattern on at least a second layer of any of the substrates, the second conducting pattern being capacitively or inductively coupled to the first conducting pattern of the antenna, the second conducting pattern acting as a parasitic element for the antenna. As an example, the antennas on the package embodiments shown in FIGS. 1-6, 11A-15 and 17-22 could become the active antenna in such an active-parasitic antenna arrangement, wherein at least an additional antenna pattern on a parallel layer on the same or other substrate would act as the parasitic element or elements of the antenna structure. The effect of such parasitic elements is primarily an increase in the bandwidth and efficiency of the antenna, together with a finer tuning of the input impedance to match the output of the output amplifier connected to the antenna.

An active-parasitic arrangement can be done in such a way that any of the package embodiments in the present invention is coupled to an external antenna by means of inductive or capacitive coupling or a combination of both. This way the antenna set inside the package becomes the active antenna and the external antenna becomes a parasitic antenna for the active antenna inside the package.

In the case of non-planar, multi-layer or volumetric structures for the antenna pattern within the package, the box-counting algorithm can be computed by means of a three-dimensional grid, using parallelepiped cells instead of rectangular and meshes with 5×5×5 cells and 10×10×10 or 20×20×20 cells respectively. In those cases, such a curve can take a dimension larger than two and in some cases, up to three.

FIG. 1 shows one embodiment according to the present invention. The package layout is arranged such that the die 103 is displaced with respect to the center of the substrate 102 to allocate the antenna 100 in the area 101. According to the present invention, the maximum side length of rectangular area 101 is the longest operating wavelength for the antenna divided by five. This particular embodiment includes a monopole antenna with a single radiating arm 100. The arm is formed by five or more segments (seven segments 111 through 117 in this particular example) with at least two angles such as 121 and 122 being less than 115°. Although not required, it is preferred that at least two of the angles that are less than 180° degrees are defined in the clock-wise and counter clock-wise directions at the opposite sides of the curve (right side for 121, left for 122). The antenna curve 100 is fed through a connection 105 to a pad on the semiconductor die, such a connection including, but not limited to, a wire bond. Other wire bonds, or similar connections, can be used to connect the die with the external circuitry by means of the pins 107. As is well known in the art, because a monopole antenna is an unbalanced, asymmetrical structure, it requires that one of the two RF terminals of the die 103 be connected to an external ground plane by means of at least one of the terminals 107. Also, in this particular embodiment, area 101 must be free of any conductor material below or above the antenna pattern 100, at least in 50% of the surface above or below area 101. In similar embodiments, the only metal that is placed below or above the antenna pattern are the conductors (such as for instance wire bonds or metal strips) interconnecting the die and the package terminals. This condition is also preferred for the printed circuit board or PCB hosting the FWSoC module.

A similar embodiment such as the one including a monopole in FIG. 1, could include a folded monopole instead. For arranging the antenna within the package as a folded monopole, the free-end of the monopole will be connected by means of a conductor to a grounding terminal of the package.

Figure 2:
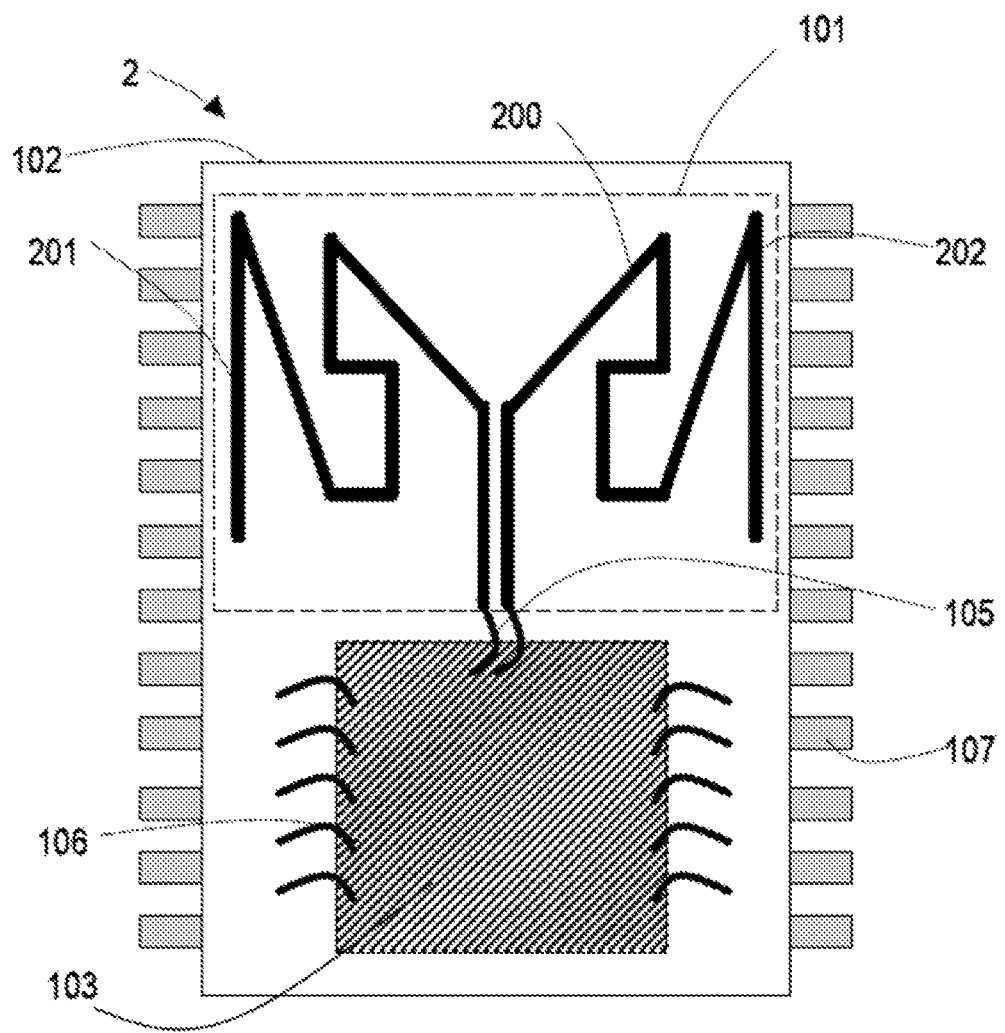
FIG. 2 shows an embodiment of an integrated circuit package including a dipole antenna, according to the present invention.

FIG. 2 shows another embodiment of the present invention where the package 2 includes a dipole antenna 200 according to the present invention. Such a dipole antenna has two radiating arms 201 and 202 and is fed by a differential input/output terminal 105, which is provided by a couple of close conductors such as for instance two wire bonds. Other suitable feeding means could include two conducting strips placed on the same layer as the antenna, the two strips reaching directly or by means of a via hole, the solder balls of a flip-chip, or the pad connection region of a flip-chip connected by means of tape automatic bonding (TAB). The substrate 102 can be a single layer or a multilayer one, but in any case it leaves a clearance with no conducting material on at least a 50% of the area 101 where the antenna is enclosed, in any of the layers above or below the layer on which the antenna is lying.

Figure 3:
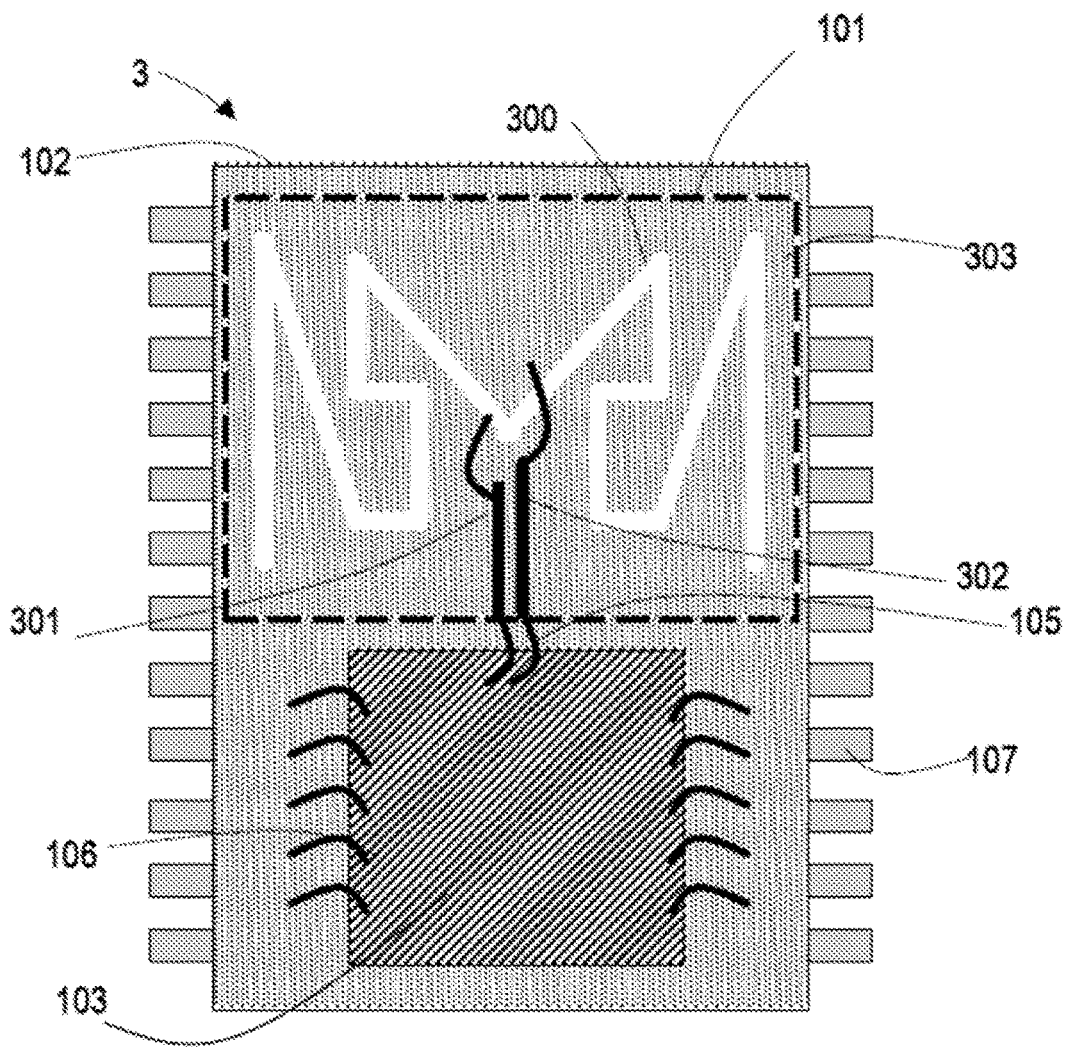
FIG. 3 shows an embodiment of an integrated circuit package including a slot or aperture antenna, according to the present invention.

FIG. 3 shows an embodiment of the present invention that includes a slot or aperture antenna in the package 3. The slot comprises a gap or slit 300 which is formed on a conducting pattern 303 placed on at least one of the layers of the package substrate, the pattern covering at least a 50% of the layer surface where the antenna is lying on. In the present example the conducting pattern covers the whole footprint of the package (except for the slot, of course, defining the antenna), although this is not required. Optionally, this conducting pattern 303 can be grounded to an external ground on the printed circuit board to which the package is mounted, by means of one or more terminals of the package like 107. To feed the slot antenna, two conducting terminals 301 and 302 are connected for instance by means of two wire bonds 105 to the die 103. Another possible way of feeding such an antenna comprises placing two conductor strips patterned on a parallel layer to the antenna layer, and connecting the two strips to a couple of points at each side of the slot by means of a via. In any case, each of the two conducting terminals 301 and 302 will be placed at opposite sides of the curve forming the slot. An alternative non-symmetrical, unbalanced feeding scheme for the antenna comprises a microstrip transmission line crossing over or below the slot. Such a microstrip transmission line can be formed so that the conducting pattern including the slot is the ground plane for the microstrip line, while the other part of the transmission line is the conducting strip lying on a parallel layer above or below the conducting pattern.

Figure 4:
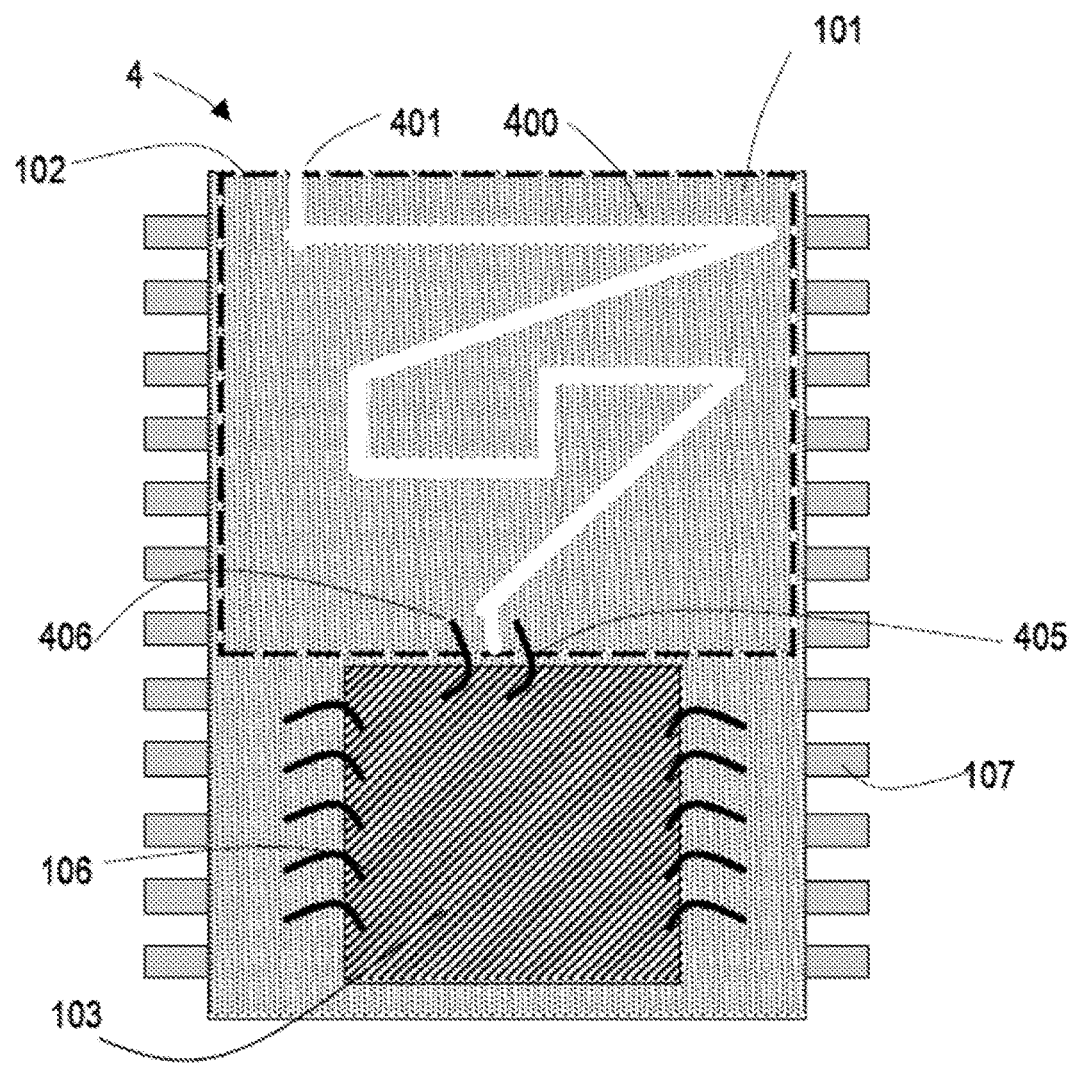
FIG. 4 shows an embodiment of an integrated circuit package including a slot or aperture antenna, according to the present invention.

Another example of a slot embodiment is disclosed in FIG. 4. In this particular case, the slot 400 intersects the perimeter of the conducting pattern where the slot is located at one point 401. In other words the slot is not completely surrounded by conducting materials as in the case of the package depicted in FIG. 3. As in the embodiment shown in FIG. 3, the slot is fed at the two opposite sides of the curve by means of two terminal conductors 405 and 406. In some applications, the slot embodiment is preferred over the monopole or dipole arrangements shown in FIGS. 1 and 2 because radiation efficiency is quite higher (current flows all over the pattern and not necessarily only along the curve). Also, the impedance can be controlled by moving the feeding terminals 405 and 406 to different points along the antenna perimeter.

One of the advantages of using slot antennas according to the present invention is that the antenna can be built over a different substrate or layer than the die. The layer or substrate including the slot antenna can be fed by means of for instance one or more vias, viaholes, vertical conductors or posts from the substrate or layer including the die. In such an arrangement, the surface covered by the conducting pattern where the slot is printed can be maximized, reaching for instance an area larger than an 80% of the overall footprint of the antenna package. An example of a package architecture including the arrangement could be based on a similar package to item 45 in FIG. 16E. The slot antenna can be for instance mounted in one of the layers 1612, while the die 1601 is lying on a multilayer substrate 1611. Although FIG. 16E describes a wire-bonding technique for the die, in many applications a flip-chip is preferred. The advantage of a flip-chip is that the connections are facing down substrate 1611, such that the top side of the die facing the upper substrates (such as 1612) where the slot antenna is mounted can include a conducting surface that shields and protects the die from the fields within the antenna.

Figure 5:
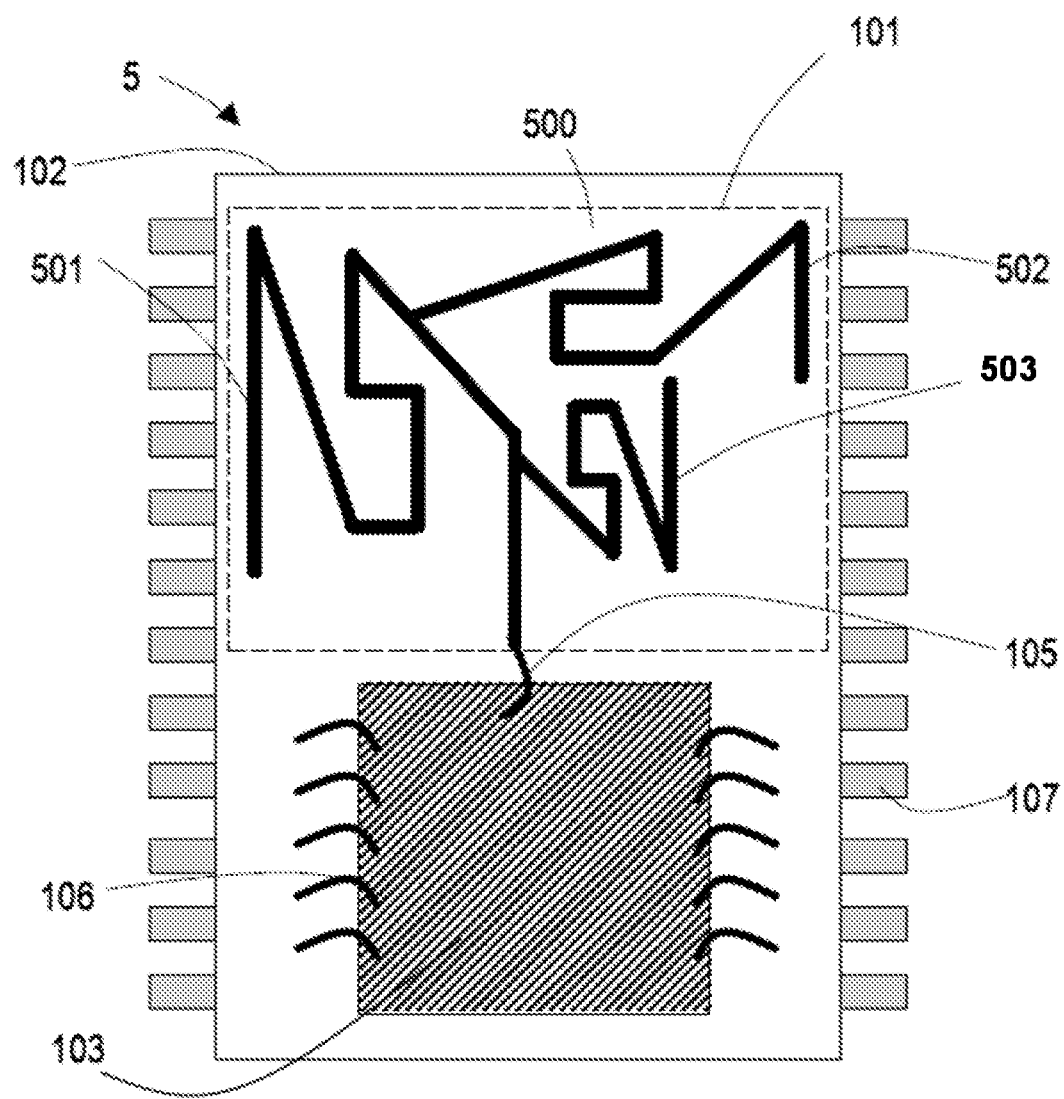
FIG. 5 shows an embodiment of an integrated circuit package including a multibranch antenna, according to the present invention.

FIG. 5 shows a multibranch antenna structure on a package 5, where several curves, with not necessarily the same lengths, intersect each other at some points. In particular, the antenna 500 includes three arms 501, 502, 503, each of them being in the form of a curve according to the present invention. In this particular example the antenna takes the form of a monopole as in FIG. 1, with a single feeding port connected to the die by means of connection 105 and one or more connections within terminals 107 connected to an external ground plane. By adjusting the number and length of the antenna arms the frequency response of the antenna can be tailored. In general, for a wide-band behavior, the length from the tips of the arms to the feeding point of the antenna will be similar. For a multiband response with no overlapping between frequency bands, the length of each arm is associated mainly with the center frequency of a particular band within the antenna response. Such a multi-branch arrangement is also compatible with, but not limited to, a dipole, an inverted F antenna, or a slot antenna.

Figure 6:
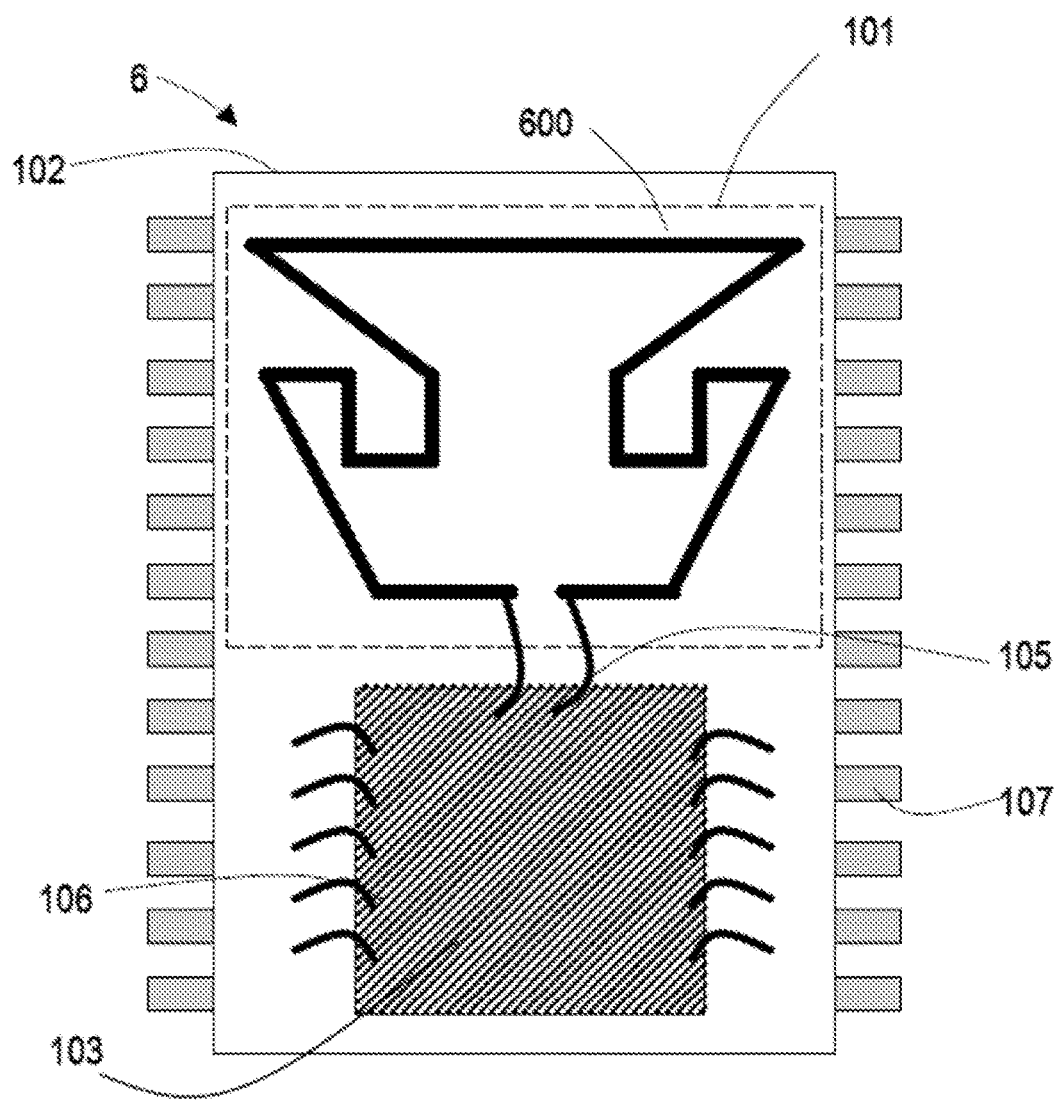
FIG. 6 shows an embodiment of an integrated circuit package including a loop antenna, according to the present invention.

FIG. 6 discloses a package 6 including a loop antenna 600 according to the present invention. In this case, the curve defines the perimeter of a loop, with two points of the loop providing the differential input terminal that is connected to the die by means of 105. Again, for an improved performance of the system, the package will be typically arranged such that the layers above or below the layer on which the antenna 600 is located will leave a clearance with no metallization or conducting material in at least a 50% of orthogonally projected area 101 on any of the layers above or below. Analogously, the package might be operated such that the PCB where the package or module is located leaves such a clearance on any layer including a metallization.

Figure 7A:
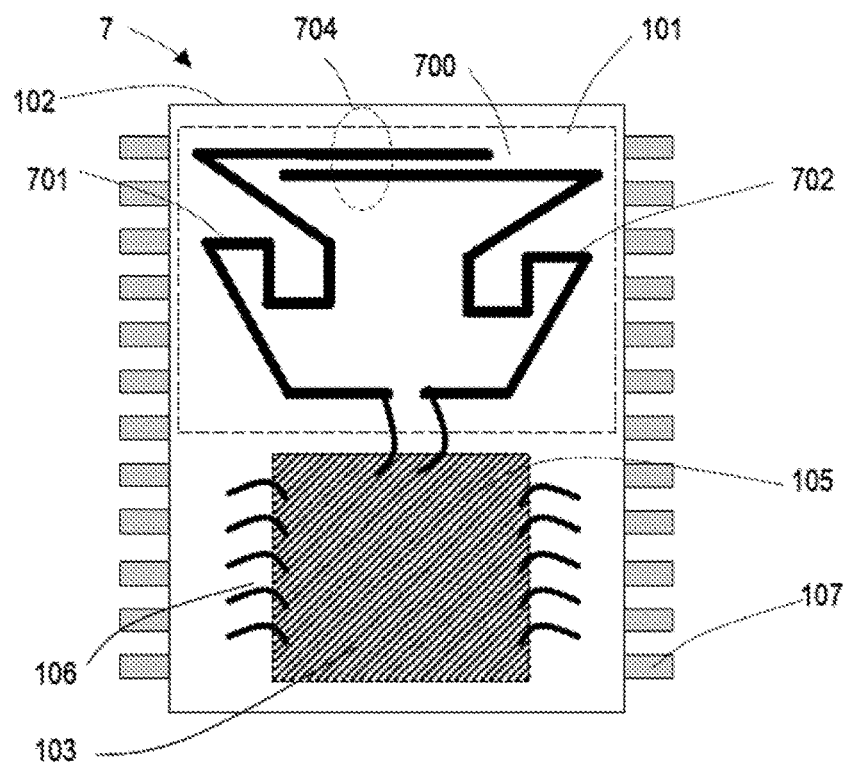
FIG. 7A shows an embodiment of an integrated circuit package including a coupled dipole antenna, according to the present invention.
Figure 7B:
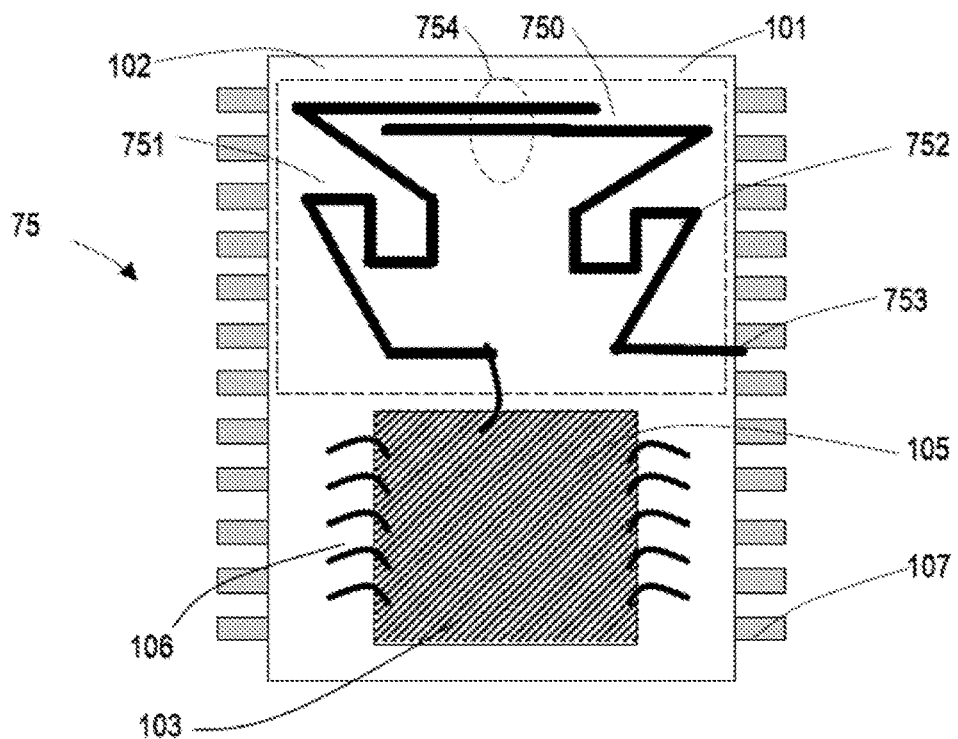
FIG. 7B shows an embodiment of an integrated circuit package including an active monopole antenna and a parasitic monopole antenna, according to the present invention, both monopoles coupled through a close proximity region.

Package 7 in FIG. 7A includes coupled dipole antenna 700 with two arms 701 and 702 which are coupled together by means of a close proximity region 704. According to the present invention, the minimum distance between conductors in 704 should be less than one-tenth of the longest free-space operating wavelength of the antenna. FIG. 7B discloses another embodiment where the package 75 includes an active monopole 751 and a parasitic monopole 752, the parasitic monopole being grounded to an external ground plane or ground counterpoise by means of at least one of the terminals of the package such as for instance 753. Also, the package will include at least another terminal within the set of terminals 107 to externally ground one of the RF voltage references of die 103. Two conducting parts of the antenna such as the active monopole 751 and the parasitic one 752 are coupled by means of a close proximity region 754 such that the minimum distance between conductors in 704 should be less than one-tenth of the longest free-space operating wavelength of the antenna.

Figure 8A:
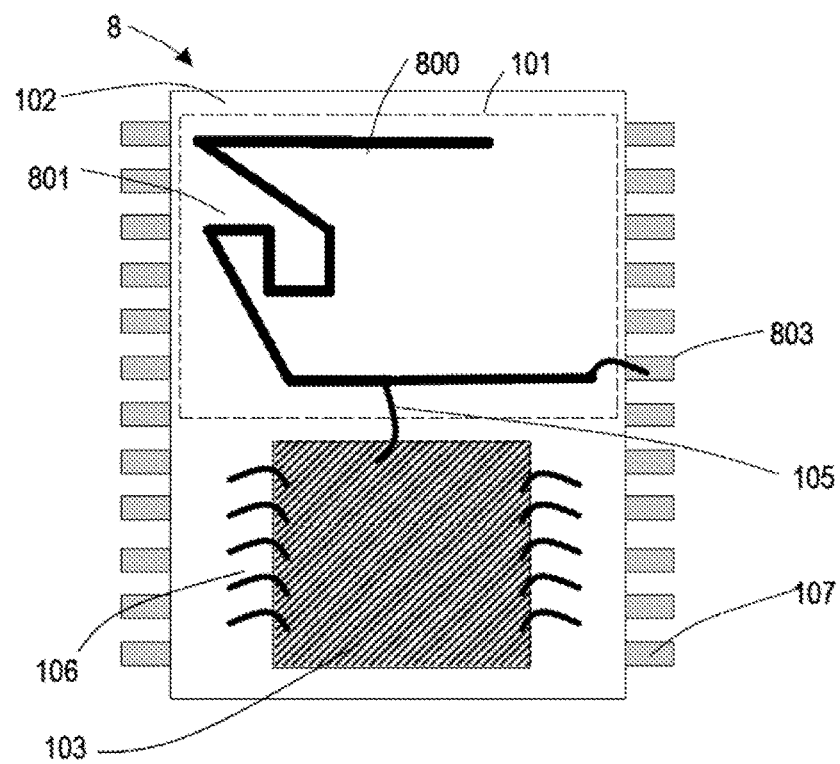
FIG. 8A shows an embodiment of an integrated circuit package including an inverted F antenna (IFA), according to the present invention.

FIG. 8A discloses a package 8 including an inverted F antenna (IFA). Similar to the previous disclosed embodiments, the die 103 is displaced from the center of the package 102 to leave an area 101 where the conducting pattern of the antenna is located. In the same way as in the previous embodiments, this pattern can be located in the layer of the package that supports the die or chip 103, or, in the case of a multilayer substrate, can be located in any of the parallel layers of the substrate 102. In case the antenna is located in a different layer than the die, it can always be connected to the proper terminal 105 of the chip by means of a via hole crossing one or multiple layers. In this embodiment, the antenna 800 is grounded at one of its tips by means of at least one of the terminals 107 of the package, such as for instance 803. Also, the antenna is fed at one intermediate point of the antenna curve by means of a connection 105 such as for instance a wire bond or a conducting strip reaching a solder ball on a flip-chip.

Figure 8B:
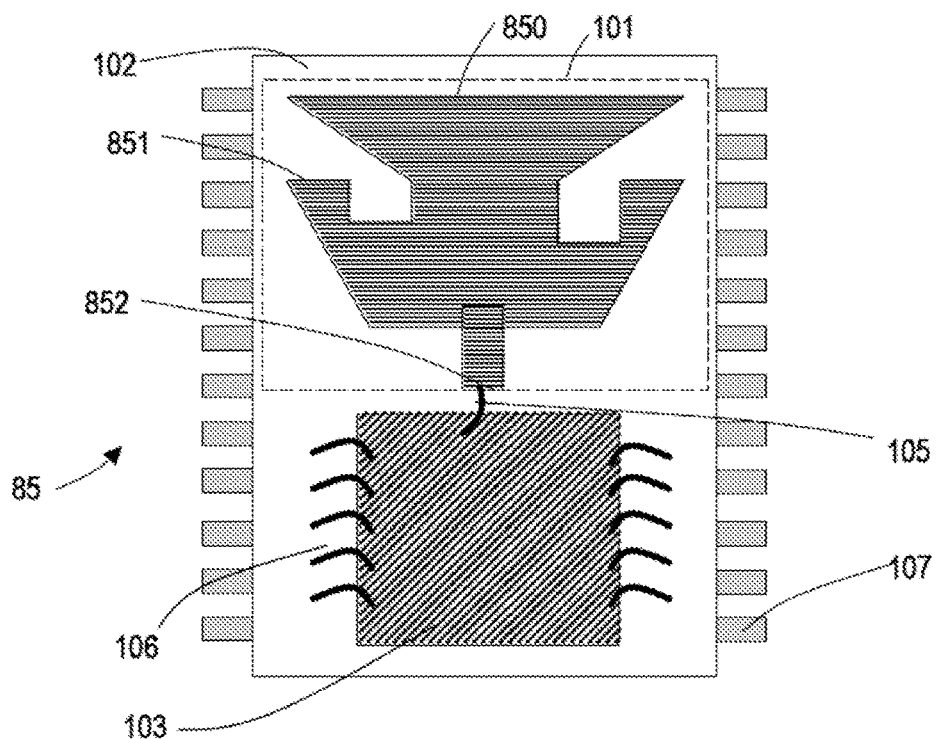
FIG. 8B shows an embodiment of an integrated circuit package including an antenna curve that defines at least a portion of the perimeter of an area.

FIG. 8B shows another embodiment of the present invention. In this case, package 85 includes an antenna curve 851 that defines at least a portion of the perimeter of an area 850, the area being filled by a conducting material. A point within area 850, such as for instance a point in region 852, is chosen as the feeding point and is connected by means of a conductor to the die 103. Such a conducting pattern can be used in many different ways. It can constitute a monopole and in this case the RF ground reference of chip 103 will be connected to an external conducting ground by means of at least one of the terminals 107 of the package. For a monopole configuration it is required that, above and below the layer on which the antenna is located, any projection of area 101 enclosing the conducting antenna pattern on any of the layers of the package or on any of the layers of an external substrate where the package is mounted leaves a clearance with no metallization at least on 50% of the projected area 101. When more than 50% of the area below 101 is filled with a conducting material, the antenna becomes a microstrip or patch antenna according to the present invention, the conducting material being the ground for the microstrip or patch antenna. The antenna also becomes a planar inverted F antenna (PIFA), if additionally, at least one short to ground is placed at any point within the conducting antenna pattern. In the case of either a microstrip or patch arrangement, or in the PIFA case, the ground covering more than 50% or the area underneath the antenna is preferred. Such a ground can be included in any of the layers of a substrate 102 supporting the antenna and/or the chip 103, or alternatively it can be included in the external substrate or PCB supporting the package.

In the case of any microstrip or patch arrangement (including a PIFA arrangement), the characteristic pattern of the invention should include a curve with at least fifteen segments, with at least seven of them being shorter than one-twentieth of the free-space operating wavelength of the antenna, according to the present invention. This is necessary to achieve the desired degree of miniaturization that allows the integration of the antenna in a small area. The rest of the general conditions that conform the essential geometric aspects of the invention, as described above, apply to the microstrip patch and their shorted versions as well.

Figure 9A:
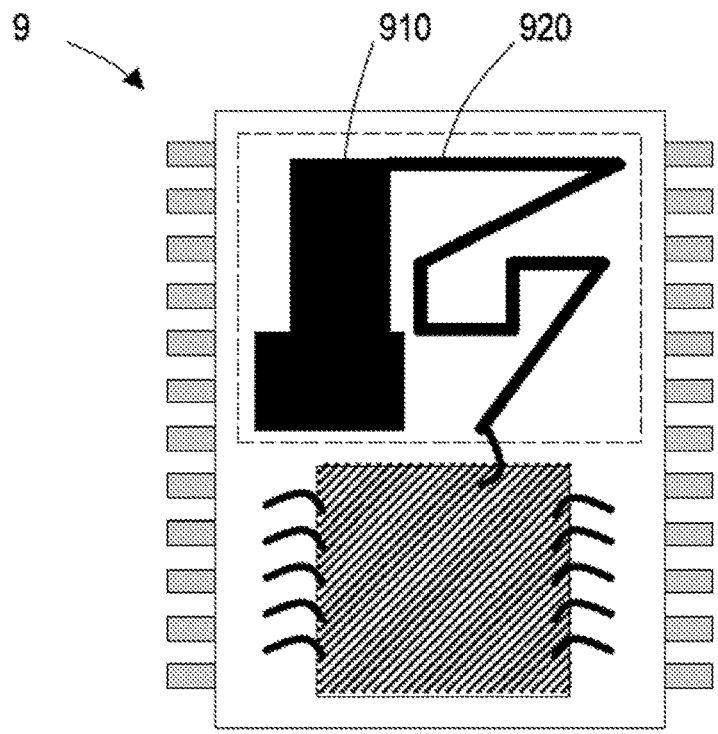
FIGS. 9A and 9B show an embodiment of an integrated circuit package including a solid conducting pattern combined with a curve, according to the present invention.
Figure 9B:
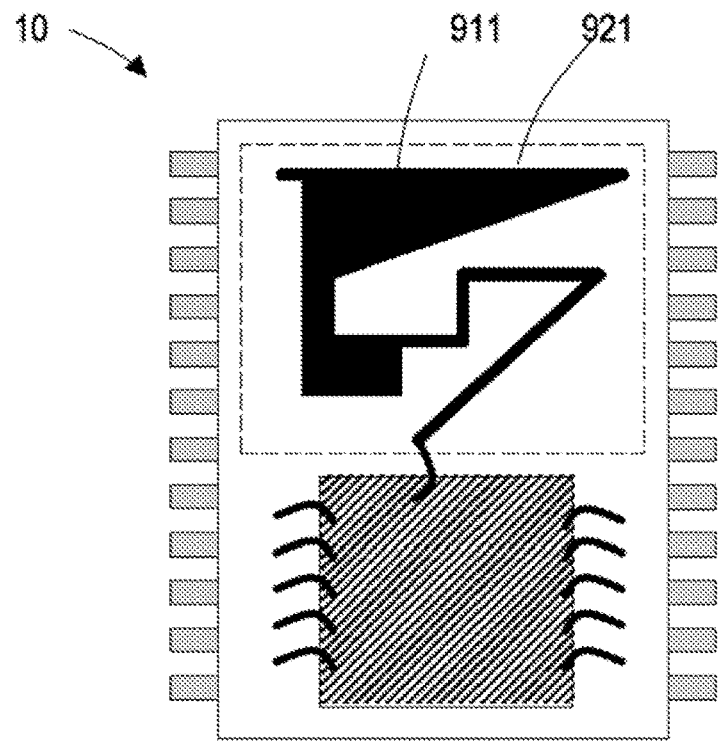

The geometry of the antenna in the present invention is not limited to being completely shaped by the characteristic curve of at least five segments. The curve needs only to define a portion or an aspect of the geometry, such as for instance a portion of the conducting strip or wire in case of a wire antenna such as a monopole or a dipole or an IFA, a portion of the slit in case of a slot or aperture antenna, a portion of the antenna perimeter in case of a patch antenna. For instance FIGS. 9A and 9B generally describe two examples 9 and 10 of packages including two antenna arrangements within the package, where a solid conducting pattern 910 and 911 is combined with the curves 920 and 921, but wherein the curves 920 and 921 do not define the entire antenna shape.

FIGS. 10A through 10N are examples of prior art space filling curves for antenna designs. Other types of multiband antennas that also feature a reduced size are multilevel antennas disclosed in WO01/22528.

FIGS. 11A through 11D show four examples of preferred embodiments of the invention. All four package examples 26 through 29 include a monopole antenna according to the present invention. In package 26 in FIG. 11A, the die 103 is displaced from the center of the package to leave space for including the antenna pattern 1100. In this particular example, the antenna pattern 1100 is defined by a space-filling Hilbert curve 14. The die 103 has one connection to the antenna pattern by means of a conductor 1104, while the second RF terminal is connected to at least one of the terminals of the package such as for instance 1101 by means of a conductor 1102.

Figure 11A:
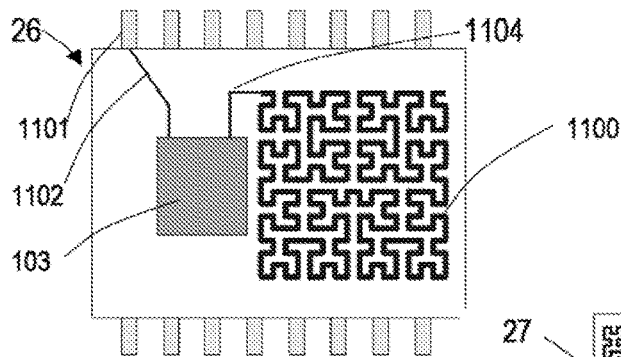
FIGS. 11A-11D show embodiments of integrated circuit packages including monopole antennas in the form of a Hilbert curve, according to the present invention.
Figure 11B:
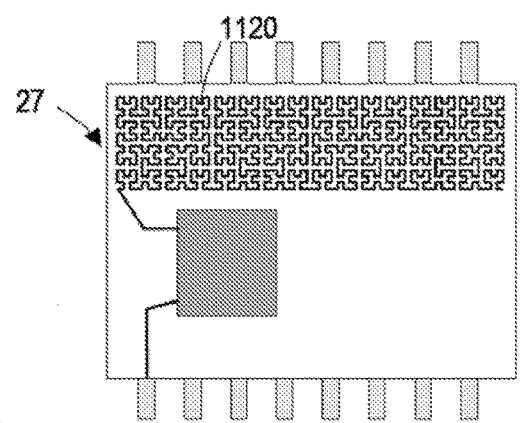

Another monopole antenna arrangement is shown in package 27 in FIG. 11B. One of the main differences between package 26 in FIG. 11A and package 27 in FIG. 11B is that the antenna pattern 1120 in FIG. 11B is arranged along the longer side of the package so that the overall antenna length is maximized inside the package. This results in an increased radiation resistance, bandwidth and efficiency for the antenna. For this purpose, the SFC curve 14 has been modified to provide the characteristic elongated shape 1120. Although the antenna pattern in this embodiment has been shown with a particular example of SFC such as 14, an analogous embodiment maximizing the antenna length could be arranged by using any of the general curves according to the present invention.

Figure 11C:
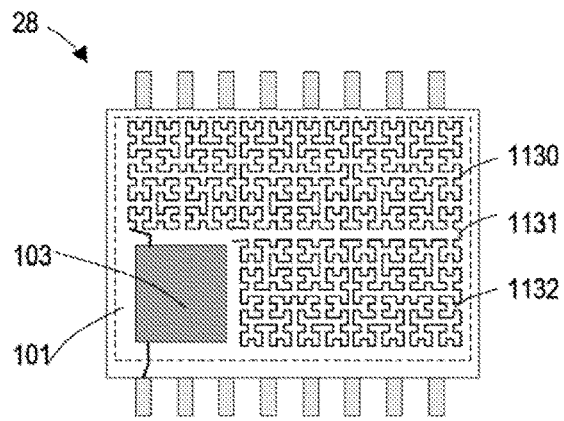

In FIG. 11C, package 28 contains another example of a monopole, where a maximum use of the available substrate surface is combined with a maximum length for the antenna pattern. The curve is split into two parts 1130 and 1132, both parts being connected by means of a conducting segment 1131. This arrangement is optimized by placing the die 103 as close as possible to one of the corners of the package. In this embodiment, the rectangular area that encloses the antenna pattern also encloses the die or chip 103. It is clear from this embodiment that it is not necessary in the present invention for the antenna and the die to be mounted in separate, non-overlapping rectangular areas.

Figure 11D:
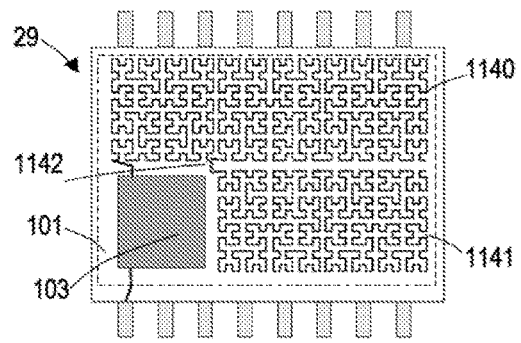

Although package 29 in FIG. 11D looks similar to package 28 in FIG. 11C, in fact it includes a different architecture for the antenna in the package. The antenna arrangement in FIG. 11D is a multibranch monopole, with a first arm 1140 and a second arm 1141, the arms being connected by means of the conducting segment 1142. Arm 1140 has one of its tips connected to the die 103, while the other tip is left free with no connection. For such an embodiment, the efficiency of the antenna is improved when the length and shape of the arm 1141 is the same as the portion of the arm 1140 that goes from the connection to segment 1142 to the free tip of the arm. This is because the current intensity on the antenna is split on two equal arms, such that the ohmic resistance is divided by two, at least in the section of the antenna that covers from segment 1142 to the tips of the two arms of the antenna. It should be noted that the area that encloses the antenna is maximized with respect to the available area on the package; this provides an increased bandwidth and efficiency to the antenna behavior as well.

It can be seen that antenna curve in FIG. 11A or 11B features a box-counting dimension larger than 1.5; in particular the dimension of this curve is between 1.9 and 2.1. It can be seen as well that if rectangle 101 is covered by a grid of 5×5 equal boxes, then the curve will cross more than 14 of the 25 boxes (about a 75% of the boxes would be crossed).

Also, it can be seen that at least one of the boxes would be crossed at least twice by the curve defining the antenna pattern. Such characteristic aspects for the antenna arrangement (a high box-counting dimension, a maximum surface usage, combined with a large number of small segments being connected to shape a very long curve) is especially suitable when a higher degree of miniaturization is required; for instance when the longest side of the rectangular area 101 is to be shorter than one-twentieth of the longest free-space operating wavelength.

Figure 12A:
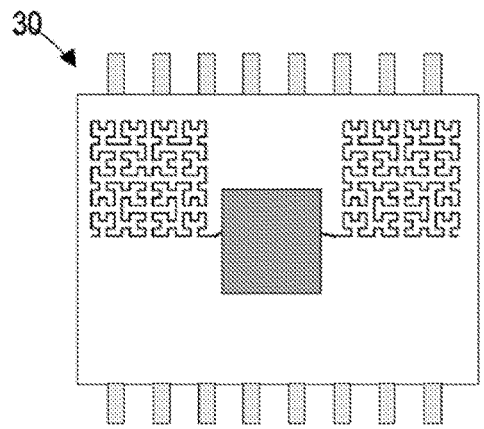
FIGS. 12A-12E show embodiments of integrated circuit packages including dipole antennas, according to the present invention.
Figure 12B:
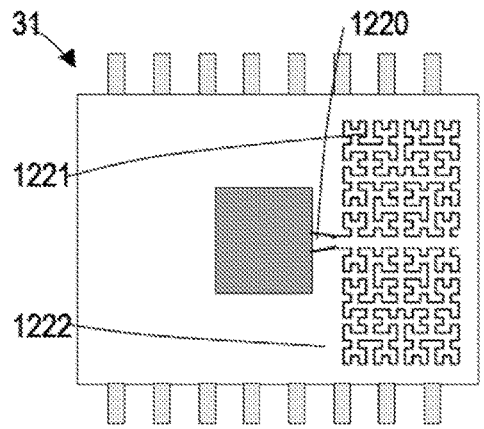
Figure 12C:
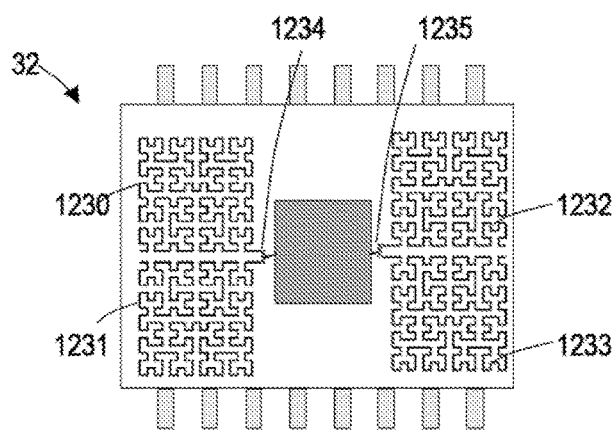

FIGS. 12A through 12E show several package embodiments including dipole antennas. In FIG. 12B, package 31, the two equal arms of the dipole 1221 and 1222 are shaped according to a curve of the present invention, and are fed by a pair of conductors 1220. Another dipole arrangement is shown in FIG. 12A, included on package 30. In this case, each of the arms are placed at opposite sides of the chip such that the overall antenna size from the free tip of one arm to the other free tip of the other arm is maximized. This provides an improved radiation resistance, bandwidth and efficiency. This can be further improved by arranging the dipole as shown in package 32 in FIG. 12C, which is a multibranch dipole. There, every arm of the dipole is split into two curves 1230 and 1231 in the first arm and 1232 and 1233 in the second arm such as the current intensity is divided by two, and the overall loss resistance is halved. The two branches of each arm are connected by means of the conducting segment 1234 and 1235, respectively. In such an arrangement the dipole length is maximized together with the transversal size of the dipole such that the overall bandwidth and efficiency of the antenna is maximized.

Figure 12D:
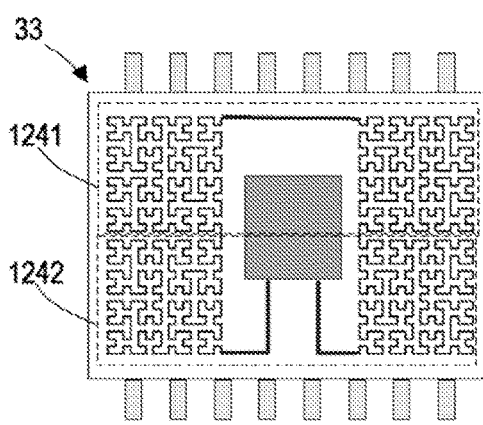
Figure 12E:
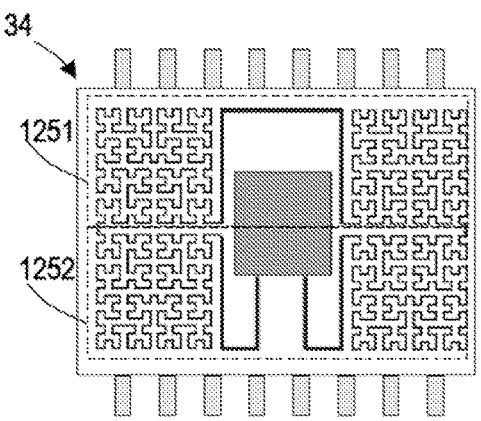

In FIGS. 12D and 12E, packages 33 and 34 can be used when the antenna is desired to operate in a folded dipole mode. In package 33, the dipole enclosed in area 1241 is equal to the dipole enclosed in area 1242, except in that the one in 1242 is fed at its center by means of a pair of conductors connected to the chip or die. Both dipoles are connected at the tips, as generally done in a folded dipole arrangement. Another possible arrangement of the two dipoles defining the folded dipole structure is shown FIG. 12E in areas 1251 and 1252 of package 34. The advantage of a folded dipole structure is that the input impedance of the dipole is increased with respect to a non-folded structure, and also the bandwidth of the antenna is improved.

It can be seen that the antenna geometries on packages 33 and 34 in FIGS. 12D and 12E form a closed loop, and therefore can define a loop antenna as well. Those structures can operate as folded dipoles or as loop antennas depending on the operating frequency and excited mode. This means that the antenna can also be operated as a multimode antenna, which can be used for instance to integrate in the same package two different communication or wireless services operating at two different frequency bands.

Figure 13A:
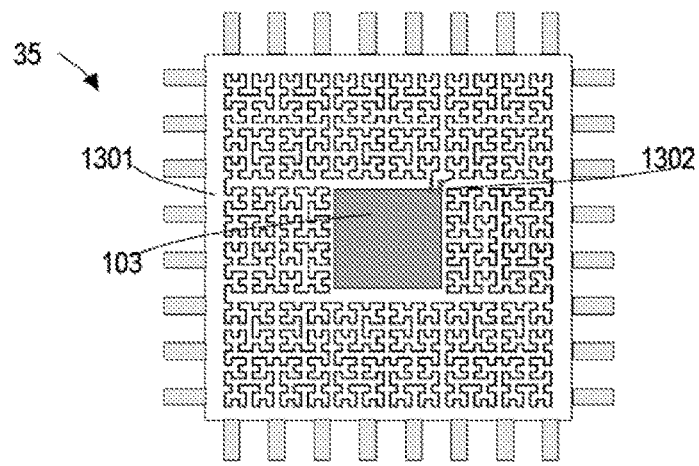
FIGS. 13A-13C show embodiments of integrated circuit packages including loop and slot antennas, according to the present invention.
Figure 13B:
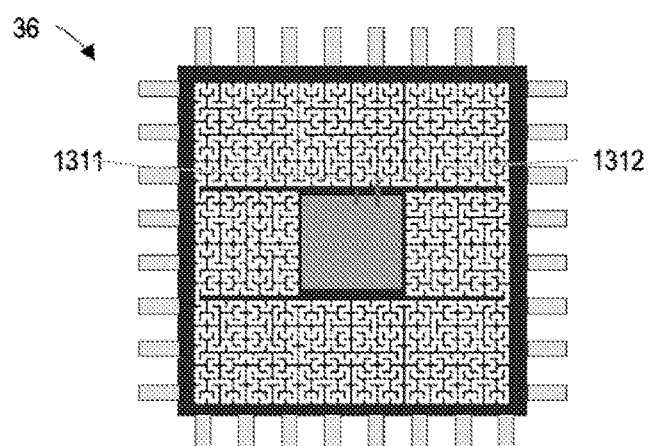
Figure 13C:
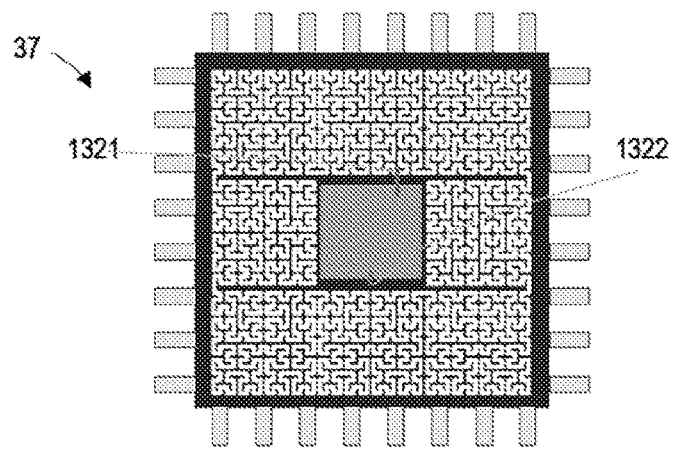

Other examples of loop antennas for an integrated circuit package according to the present invention are described in FIGS. 13A-C. In FIG. 13A, package 35 includes a conductive curve 1301 constructed by means of several Hilbert-like sections around the semiconductor die 103. The loop is fed by means of a differential input/output port formed by a pair of conductors 1302. Again, such an arrangement maximizes both the perimeter and the area covered by the loop. The box-counting dimension of this curve is between 1.9 and 2, providing a high package density for operation at very low frequencies. This is another example of an embodiment where the die is placed inside the rectangular area enclosing the conducting pattern of the antenna. To protect the chip from the intense magnetic field flowing inside the loop, the chip can include a conductive layer shielding at least one of its surfaces. For this purpose, a flip-chip arrangement would be preferred.

Package 36 in FIG. 13B is the dual version of the package 35 shown in FIG. 13A, where the loop takes the form of a slot on a conducting pattern in any of the substrate layers supporting the die. The same advantages in terms of package density and maximum usage of the available surface are obtained in this case. The feeding scheme of such a loop is also differential, with one conductor 1311 connected to the conducting region inside the loop, while a second conductor 1312 is placed at the opposite side of the curve, on the outer conducting area. As shown in FIG. 13C, the two conductors 1321 and 1322 do not need to be close together on the same side of the die, they can be for instance at opposite sides. Depending on the relative position of the two conductors, the impedance will change, which is useful for tuning the antenna to match the required output impedance of the output RF amplifier inside the die.

Figure 14A:
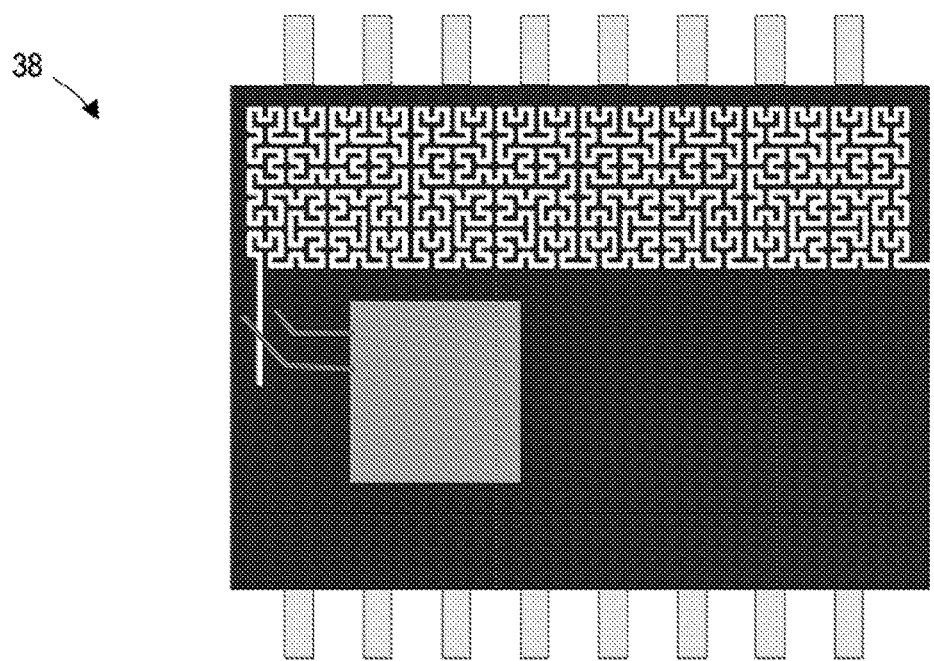
FIG. 14A shows an embodiment of an integrated circuit package including a slot monopole antenna, according to the present invention.
Figure 14B:
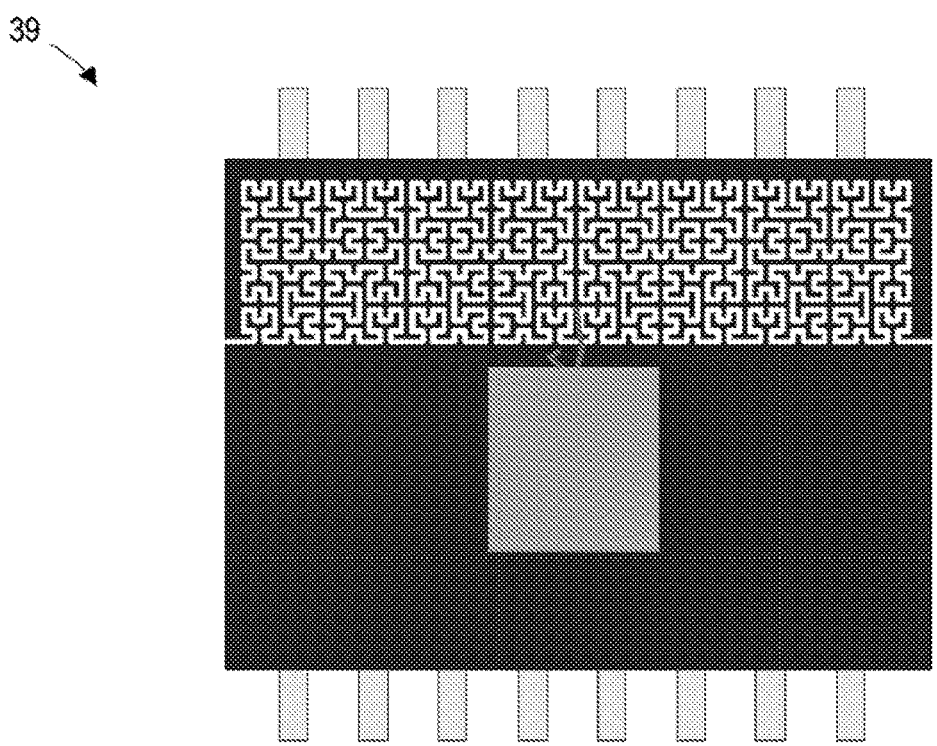
FIG. 14B shows an embodiment of an integrated circuit package including a slot dipole antenna, according to the present invention.

Package 38 in FIG. 14A is the dual version of the monopole in FIG. 11B. It shares the same advantages in terms of maximizing efficiency and radiation resistance due to maximum use of available length. In fact, it can be seen as a combination of package 27 in FIG. 11B and package 4 in FIG. 4. Like package 4 in FIG. 4, the antenna is a slot, and that the slot intersects the perimeter of the conducting pattern including the slot at one point. Other combinations are possible, such as for instance including the two tips of the slot inside the conductive pattern supporting the slot, as in FIG. 3, or having both ends intersecting the perimeter of the pattern as shown in package 39 in FIG. 14B.

Figure 15:
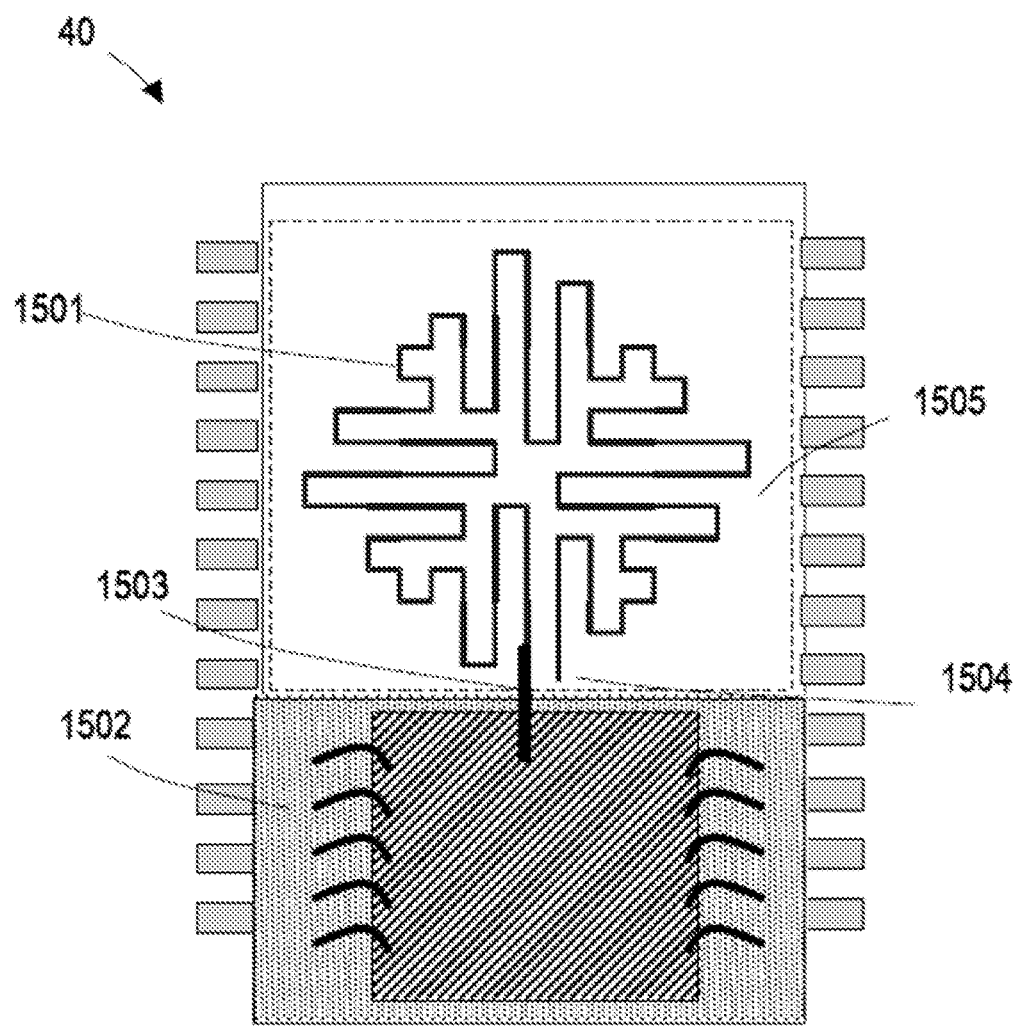
FIG. 15 shows an embodiment of an integrated circuit package including a monopole antenna and a grounding plane or ground counterpoise, according to the present invention.

FIG. 15 displays a package including a monopole antenna 1501. In this example, a part of the grounding plane or ground counterpoise 1502 is placed on the same layer as the antenna, in such a way that it does not overlap the rectangular area 1505 in which the monopole arm 1501 is enclosed. The antenna is fed through one conductor 1503. In this particular embodiment, it is shown how the tip of the monopole 1504 can be put close to the ground plane 1502. This would provide some capacitive loading to the antenna that contributes to the overall antenna miniaturization.

FIGS. 16A-16E describe, without any limiting purposes, several examples of conventional package architectures (items 41, 42, 43, 44, 45) for integrated circuits. All of them share some common part arrangements. In most of the cases a semiconductor die or chip 1601, 1606 is attached to a substrate or laminate 1610, which is one of the most important parts of the package. Such a substrate or laminate acts as a mechanical support for the semiconductor die or chip, contributes to the heat removal from the chip, and provides several terminals 1603, 1604 to electrically connect the chip with the outside world. The chip and the package can be interconnected in many ways. A most common way is by means of wire bonds 1602, although other techniques such as for instance, tape bonding or flip-chip technologies are possible. The package is usually enclosed in a plastic mold or encapsulated 1615 to protect the chip and the interconnections with the terminals.

Figure 16A:
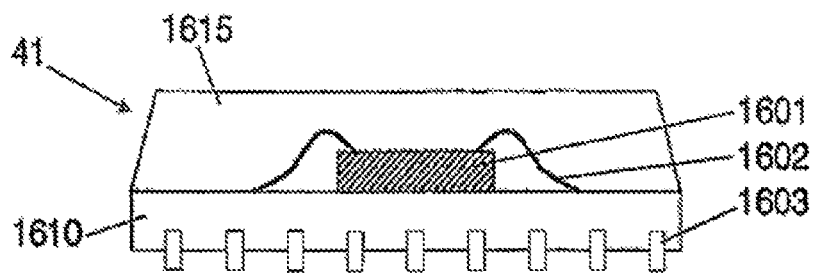
FIGS. 16A-16E show conventional package architectures suitable for use in the integrated circuit packages of the present invention.
Figure 16B:
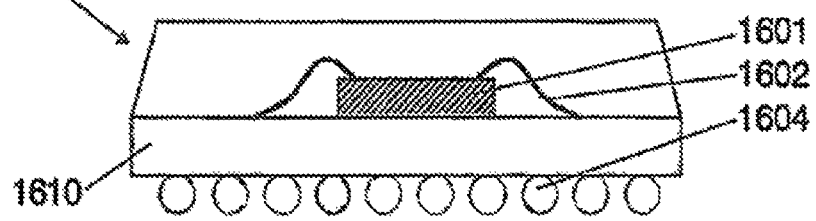
Figure 16C:
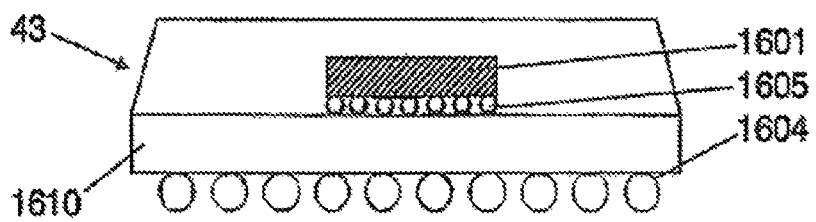

Item 41 in FIG. 16A is an example of a package architecture where the terminals are pin connections. Such pin connections are common in DIL, DIL-SMT, QFP and PGA packages. Usually such pins surround the perimeter of the package and are connected to the chip directly by means of wire bonds or by conducting strips on top of the package substrate. In some cases, a metal frame includes both terminals and conducting strips that are connect (usually by thermocompression) through wire bonds to the chip. In the case of a PGA package, the terminals are not only arranged around the perimeter of the package but in a 2D grid array underneath the package. This is typically employed when a high terminal count for both the chip and the package are required.

Items 42, 43, 44 and 45 in FIGS. 16B-E show several examples of BGA packages, wherein the pin terminals are replaced by solder balls 1604. Such an interconnection technique is also characteristic in flip-chip architectures (see items 43 and 44), wherein the chip is connected to the package by an analogous scheme. In a flip-chip arrangement, the chip is mounted upside-down, with connections facing down the packages substrate or laminate. In such an arrangement, the interconnection is done by means of a grid of conducting balls or bumps 1605.

Figure 16D:
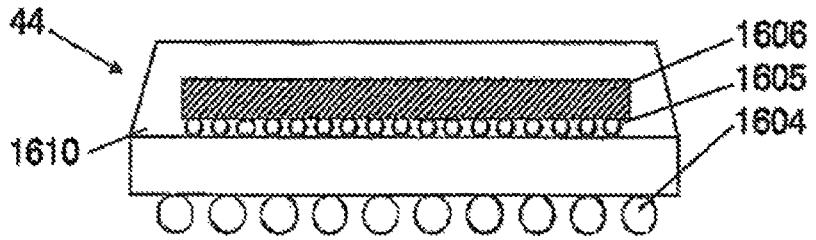

The market pressure for reducing the size and cost of integrated circuit packages has resulted in a set of new architectures to increase the functionality of the chips while reducing the footprint of the package. Item 44 in FIG. 16D shows a chip-scale package (CSP), wherein the package is shrunk to almost match the reduced footprint of the chip.

Figure 16E:
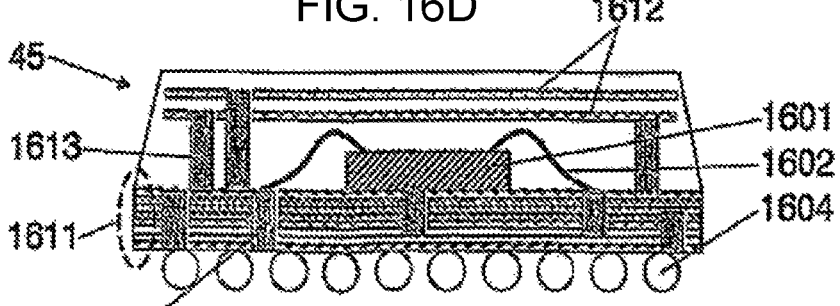

Other means of increasing the package density include the use of multilayer structures within one or several substrates in the package. Item 45 in FIG. 16E is an example of a package architecture where a plurality of dielectric layers 1611 are attached to each other to form the substrate that supports the chip. Every layer on the substrate can support several metallizations and conducting strips to interconnect the chip 1601 with terminals 1604, or to other chips or electrical components (such as for instance resistors, capacitors, inductors, filters, mixers, amplifiers, oscillators, etc.) mounted on the substrate. Such metallizations on the layers can be interconnected by means of vias and via holes 1614. Additionally, other laminates or substrates 1612 can be included above or below the chip to support additional components or chips. Again, such additional substrates can be interconnected with other substrates by means of vias and via holes.

Figure 17:
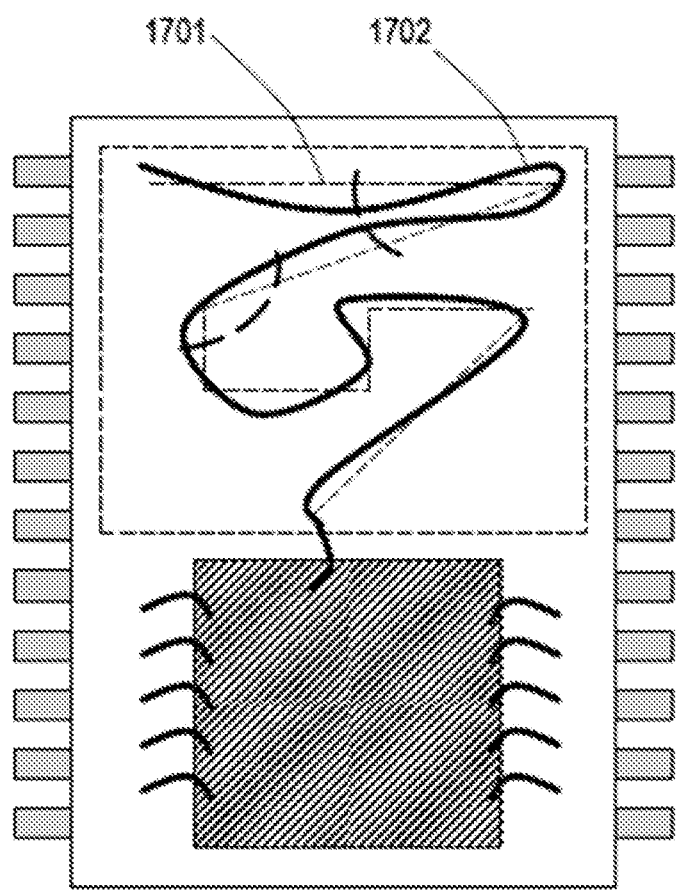
FIG. 17 shows an embodiment of an integrated circuit package including an antenna having non-linear segments, according to the present invention.

Although the segments that make up the curve forming the antenna of the present invention are shown as being linear in the Figures, the present invention is not limited to curves formed only from linear segments. One or more of the segments making up the antenna curve of the present invention may be non-linear, up to and including all of the segments of the antenna curve. For example, as shown in FIG. 17, curve 1702 includes several non-linear segments. When the antenna curve of the present invention includes at least one non-linear segment, the shortest distance between any point on the curve having the at least one non-linear segment and an identical curve formed entirely of linear segments is less than one-tenth of the longest free-space operating wavelength of the antenna. This is true no matter how many non-linear segments are in the curve. As depicted in FIG. 17, curve 1701 (shown in dashed lines) represents an all-linear curve that is identical in shape to curve 1702, which has non-linear segments. The shortest distance between any point on curve 1702 and curve 1701 is less than one-tenth of the longest free-space operating wavelength of the antenna.

Figure 18A:
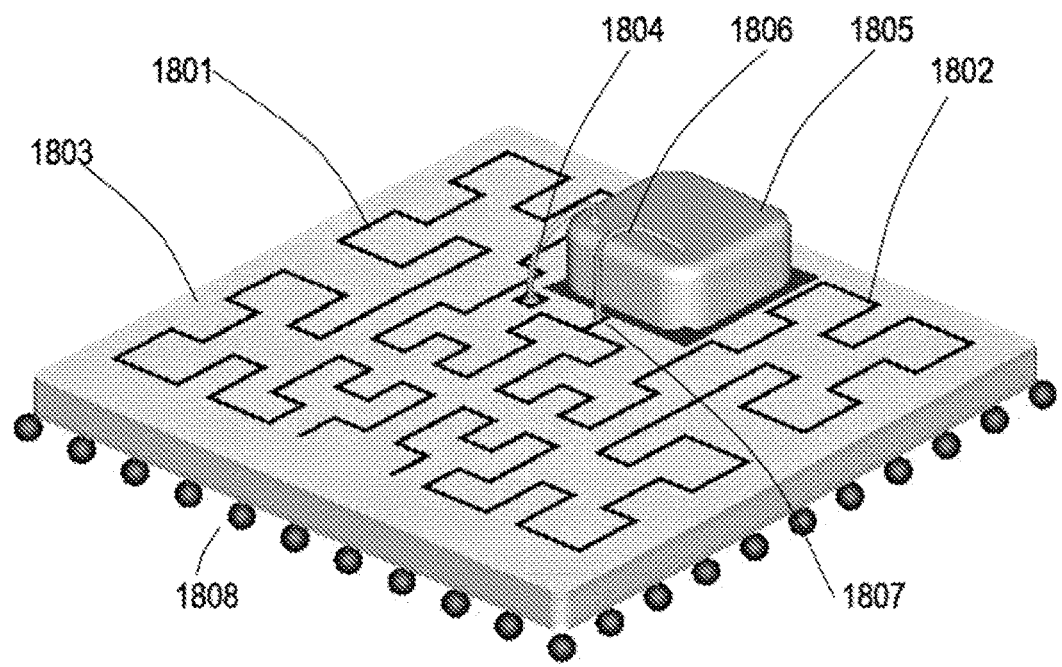
FIGS. 18A and 18B show a perspective view (above 18A) and a top plan view (below 18B) of an embodiment of an integrated circuit package including a multibranch monopole antenna, according to the present invention.

Additional examples of how the package can be arranged according to the present invention are shown in FIGS. 18A through 21B. FIGS. 18A and 18B show a multibranch monopole arrangement, with two identical arms 1801 and 1802 which are symmetrically arranged on the two halves of the package substrate. The die 1805 is displaced from the center of the substrate 1803 of the package but it is located near the center point of one of the substrate edges. This allows the two arms to symmetrically grow from the segment 1807. The area covered by the antenna is maximized, while keeping a maximum length of the two curves to allow efficient antenna size compression. In particular, a grid of 5×5 cells over the package would include a portion of the curve in about at least an 80% of the cells. The box-counting dimension of the curve is close to 2.

The embodiment in FIG. 18A shows a semiconductor die 1805 which includes at least two RF connections 1804 and 1806 for the antenna. Connection 1806 is made at the input of the double-branch structure, while connection 1804 is connected to one of the terminals 1808 of the package by, for instance, a via hole on substrate 1803 and a conducting strip in a second layer of the substrate 1803 that connects the via hole with at least one of the terminals 1808. Terminal 1808 would be connected to an external ground-plane, such as for instance a conducting layer on a printed circuit board or PCB. Although wire bonds are shown as an example in FIGS. 18A-18B, it will be clear to one skilled in the art that other interconnection arrangements (such as for instance flip-chip or TAB) could be used as well to interconnect the chip 1803 with the terminals on the package 1808.

Figure 18B:
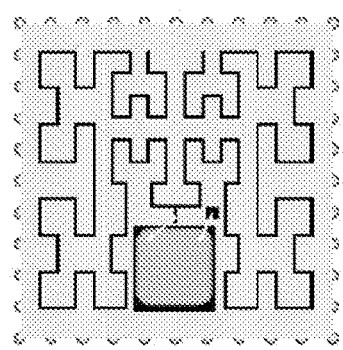

An embodiment with an antenna arrangement such as that shown in FIGS. 18A and 18B, could be used for instance to package an antenna operating at 2 GHz in a package smaller than 10×10 mm (that is a package with a size smaller than one-fifteenth of the free-space operating wavelength of the antenna). This is not considering the potential extra reduction in size obtainable by combining such an antenna design with a high dielectric constant substrate for 1803. This means that conventional, low-cost package materials such as polyimide compounds could be used instead of using a higher-cost, higher permittivity dielectric material. On the other hand, some extra miniaturization of the antenna and the package can be achieved if the package is made of a high permittivity material, at the expense of some extra losses (less efficiency) and some narrowing of the electrical bandwidth. Applications for such an embodiment could be for instance a FWSoC for Bluetooth™, for WLAN IEEE802.11 or for UMTS/3G-WCDMA.

Figure 19A:
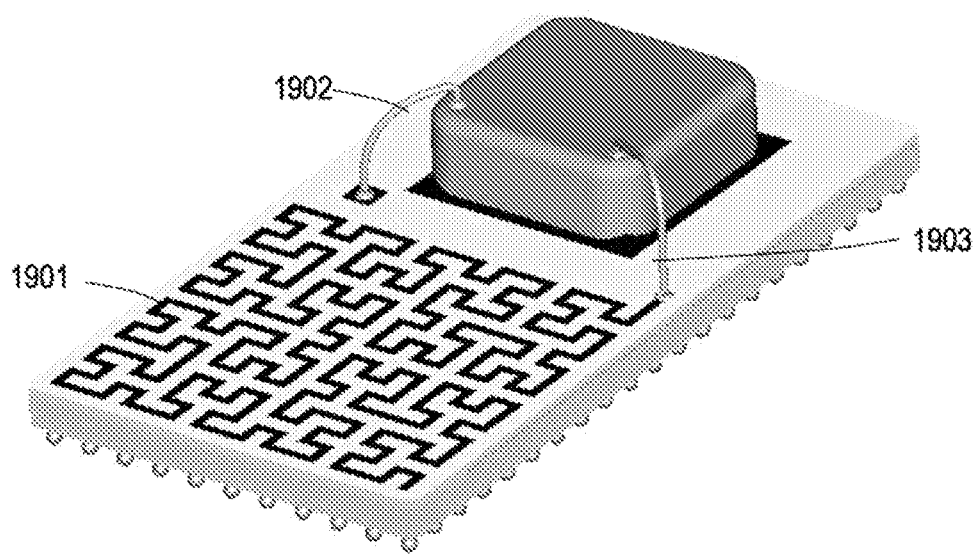
FIGS. 19A and 19B show a perspective view (above 19A) and a top plan view (below 19B) of an embodiment of an integrated circuit package including a monopole antenna, according to the present invention.
Figure 19B:
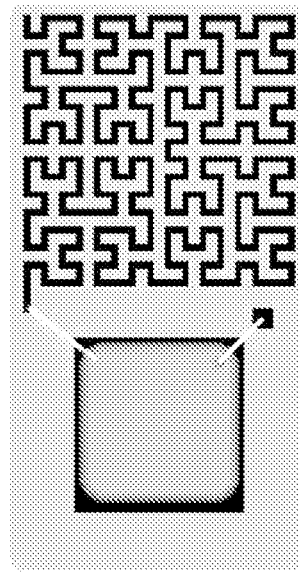

FIGS. 19A and 19B show another example of embodiment according to the present invention. The package includes a monopole antenna, the monopole antenna including a single radiating arm, the arm being fed at one point. The die provides one connection to the antenna and one connection to an external ground. In this case the package is arranged in a rectangular geometry, providing approximately one half of the package for the antenna and the other half for the die. For maximum size compression, a box-counting dimension of about 2 is desired for the antenna curve. This arrangement would allow, for instance, a FWSoC systems operating around 2 GHz (including, but not limited to, FWSoC for Bluetooth™, for WLAN IEEE802.11 or for UMTS/3G-WCDMA) to be packaged in a module smaller than 10×5 mm. In this case as well, the minimum rectangle enclosing the antenna has the longest side smaller than the corresponding longest free-space operating wavelength divided by 30.

Figure 21A:
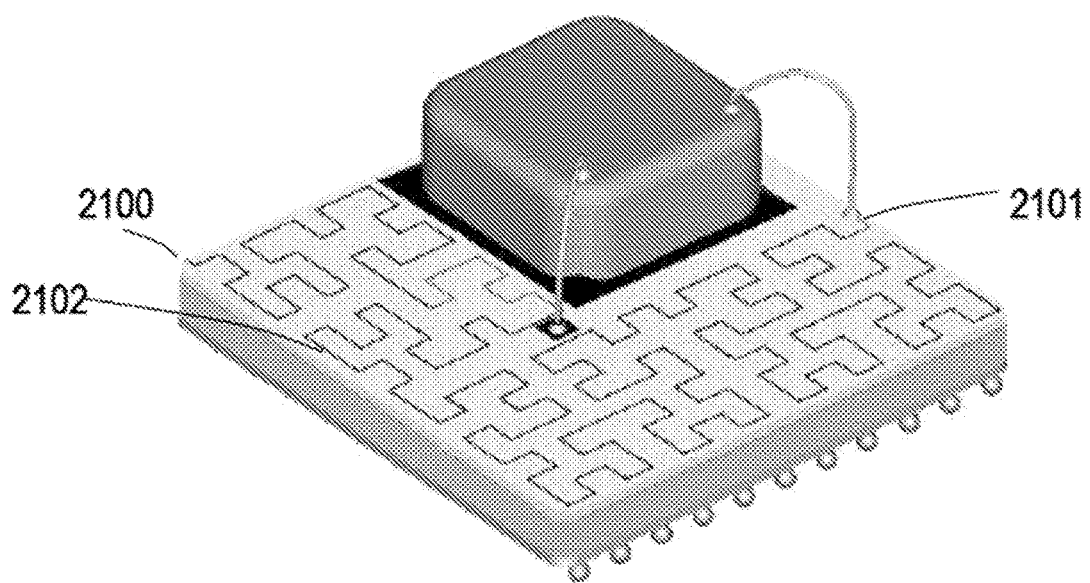
FIGS. 21A and 21B show a perspective view (above 21A) and a top plan view (below 21B) of an embodiment of an integrated circuit package including a L-shaped monopole antenna, according to the present invention.
Figure 21B:
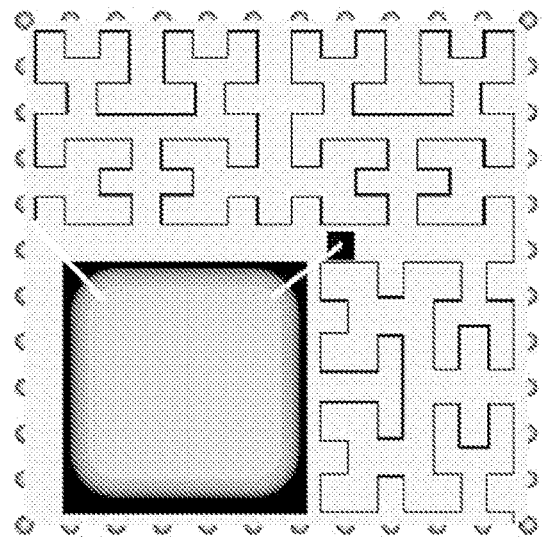

For very small packages, such as for instance, a squared package of a size around one-thirtieth of the longest free-space operating wavelength of the antenna, other embodiments provide efficient solutions according to the present invention. In FIGS. 21A and 21B for example, the chip or die is arranged near a corner of the package, such that an 'L' shaped area is left free on the package substrate for the conductive pattern of the antenna. In such an arrangement, a monopole defined by a single radiating arm, the arm taking the shape of a curve 2102 according to the present invention is used. It is preferred that a first tip 2101 of the curve is near the edge of the package at one end one the L-shaped area, while the free tip 2100 of the monopole is left at the other end of the area. A box-counting dimension of about 2 is preferred for achieving such a high package density.

Figure 20A:
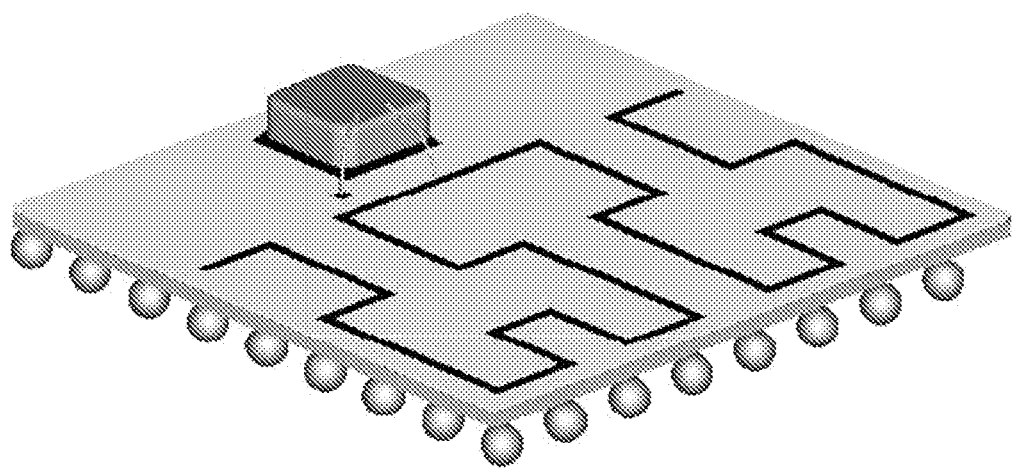
FIGS. 20A and 20B show a perspective view (above 20A) and a top plan view (below 20B) of an embodiment of an integrated circuit package including a monopole antenna, according to the present invention.
Figure 20B:
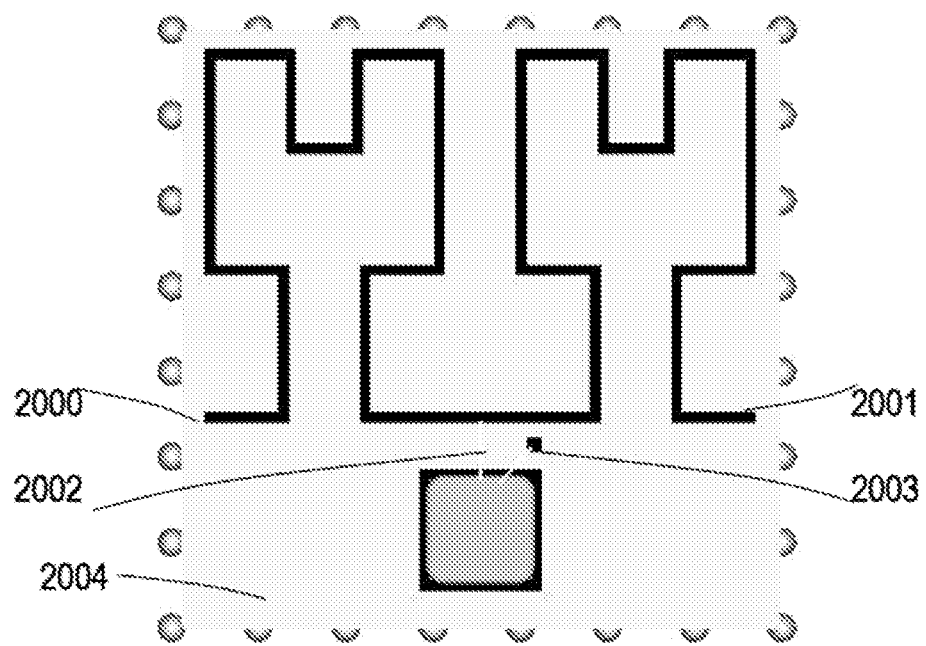

For some slightly larger packages (for instance a square package of side length around one-tenth of the longest free-space operating wavelength of the antenna), it is preferred that the antenna pattern includes a smaller number of segments, yet fills as much as possible the available space. A package including a monopole antenna with such characteristics is shown in FIGS. 20A and 20B. In this embodiment, the monopole includes two equal radiating arms 2000 and 2001 that are interconnected by a point which in turn is used to feed the antenna by means of a conductor 2002. As in other monopole configurations, second conductor is used to connect the second RF output or ground reference for the chip to an external ground reference. A wirebond is connected to a via hole 2003. The via hole 2003 connects the wirebond to a strip that runs on another layer until it reaches at least one of the terminals of package that will be connected to an external ground.

Figure 22:
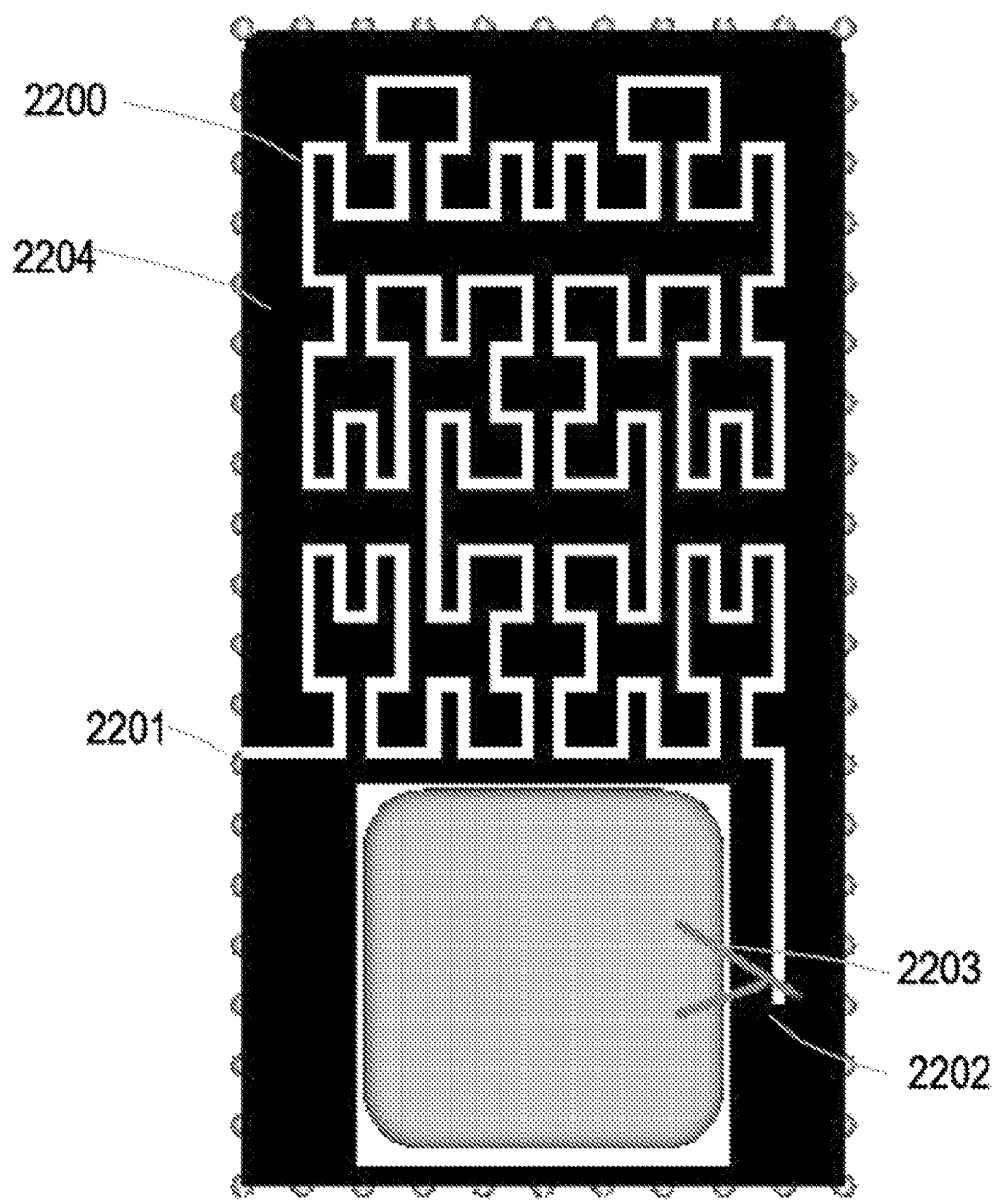
FIG. 22 shows a top plan view of an embodiment of an integrated circuit package including a slot antenna, according to the present invention.

An alternative embodiment for a package according to the present invention is shown in FIG. 22. Here the antenna is a slot 2200 on a conducting pattern 2204, the pattern completely covering a layer of package substrate except for the slot. Optionally, some via holes are used to interconnect other layers above or below the conducting pattern. Preferably, the conducting pattern 2204 is connected to one or several of the package interconnections to allow the connection of the pattern to an external ground. In this embodiment, slot 2200 has one of the tips 2201 intersecting the external perimeter of the conducting pattern 2204. The other tip 2202 is completely surrounded by the pattern 2204. Again the antenna is fed by a pair of conductors, such as for instance a couple of wire bonds, each of the conductors being connected at some point at each of the sides of the slot. Also, a high box-counting dimension (of about 2) is required to achieve such a high package density, and the curve preferably is chosen to cross at least 75% of the boxes within the smallest 5×5 grid that covers the antenna.

Those skilled in the art will notice that, although for the sake of clarification most of the previous embodiments are described in the Figures in a wire bond configuration, those embodiments are compatible with other chip interconnection techniques, such as for instance flip-chip or tape bonding techniques. Also, the present invention allows several ways for interconnecting the chip and the terminal or terminals of the package. One possible way according to the present invention comprises arranging several conducting strips on at least a different layer than the conducting antenna pattern. To minimize the coupling between the strips and the interconnections between the chip and the package terminals, it is preferred when possible to arrange such strips such that every crossing of the strips over or below any segment of the antenna structure is made in a perpendicular direction. In those packages where the terminals form a two-dimensional array of terminals (such as for instance in those packages within the families of ball grid arrays, and pin grid arrays), the present invention discloses an advantageous way of arranging the antenna curve and the package terminals such a minimum interference occurs. Such an arrangement consisting of choosing an antenna geometry wherein the curve includes a number of segments according to the present invention, wherein those segments form a 90° angle with adjacent segments at least at the region on top of the array of terminals, the antenna geometry being chosen so that the antenna curve follows a path along a rectangular mesh where the lines of the mesh are equidistant from the terminal pins or balls. Non-limiting examples of curves that allow such arrangement are curves based on Hilbert, Peano, SZ and ZZ geometries. It becomes clear that other curves including 90° bends such as those in FIG. 11A-D, 12A-E, 13A-C, 14A-B, 15, 18A-B, 19A-B, 20A-B, 21A-B, or 22 could be used for that purpose as well.

Although the previous embodiments show a direct feeding of the antennas from the chip, other feeding schemes are allowed within the present invention. For instance, other passive or active components such as resistors, capacitors, inductors, filters, resonators, transmission lines, baluns, mixers, diplexers, amplifiers or other RF networks could be placed between the antenna and the chip. This can be enabled through many different packaging architectures and techniques such as for instance any of the multi-chip module techniques such as MCM-L, MCM-C, MCM-D or MCM-D/L.

One particular way of connecting the antennas of the previous embodiments with the chip or intermediate RF networks is by means of capacitive coupling. Capacitive coupling is provided by two conductors placed in close proximity but not in direct contact, the conductors being ohmically connected to the antenna and to the chip or intermediate RF network, respectively. For instance, the two conductors can consist of two pads on a substrate of the package, the pads being either coplanar or lying one on top of the other on separate layers of the substrate. In other embodiments, such a coupling can be provided by a pad on the chip and a pad on the substrate connected to the antenna pattern.

Another possible feeding scheme for the antenna is by means of inductive coupling, wherein a loop of current connected to the chip is coupled to a loop within the antenna conducting pattern. Both loops, the one connected to the chip and the one in the antenna, can be lying on the same layer of the substrate, or alternatively they can be aligned one on top of one another on separate layers either within the same substrate or in different substrates within the same package, to maximize coupling between both loops.

It should be clear that the chip and antenna arrangements shown in the Figures, and others within the spirit of the present invention, can be arranged in several kinds of package topologies. For instance, many of the DIL topologies shown can be exchanged with SIL, QFP, PGA and BGA packages. In general, there is no limitation for any of the antenna designs shown in the present invention for combination with any kind of standard package topologies: single-in-line (SIL), dual-in-line (DIL), DIL-SMT, quad-flat-package (QFP), pin grid array (PGA), ball grid array (BGA) and its derivatives PBGA, CBGA, TBGA, SBGA, □BGA.

Another possible way of arranging the conducting pattern of the antenna is building it in or upon the plastic mold encapsulating the whole package. The pattern can be for instance connected to the chip by means of a capacitive or inductive coupling to a conducting element on one of the package substrates, the conducting element comprising for instance a radiating arm of the antenna, or a reactive loop or pad of the substrate connected to the die or to an RF component or network connected to the die. The conducting pattern of the antenna can be built on such a plastic mold by several means, such as for instance a two-shot injection process, a co-injection process, an insert molding process or an MID process.

Although a multiband antenna such as for instance a multibranch antenna can be used within the package when several services or operating frequency bands are to be integrated in the same system, it is clear that other options within the present invention include arranging two or more antennas within the same package. For instance, those two or more antennas according to the present invention can be arranged in the same substrate layer, in different layers within the same substrate, in different substrates or even in the substrate and in the plastic casing of the package. One possible arrangement for a two antenna package includes two similar antennas wherein each one is fed independently, and wherein one conducting pattern is rotated 90° with respect to the other antenna pattern. This provides an effective means for integrating a polarization diversity communication system inside a single package.

The packaging techniques including an RF antenna according to the present invention provide an effective means of compressing the size of a wireless system such that it becomes feasible to integrate such a system in a small package. For instance, the present invention enables packaging a system operating within the 0.5 to 5.5 GHz frequency band in an area smaller than 10×10 mm. For instance, a package such as that shown in FIGS. 21A-21B can integrate a full wireless system operating at the ISM 2.4 GHz band in an area smaller than 16 mm², without requiring the use of expensive high permittivity materials. This opens the scope for many new applications for systems such as for instance Bluetooth™, IEEE802.11a, IEEE802.11b, Hyperlan, Hyperlan2, UMTS, GSM900, GSM1800, PCS1900, AMPS, WCDMA, DECT, and GPS.

Any of the antenna designs arranged according to the present invention can be integrated also inside the semiconductor die. Although this possibility increases the cost of the system, it can be convenient at higher frequencies where the whole system is to be integrated inside the chip (SoC). Also, the same designs inside the package could be used as a single antenna component without the chip.

The package arrangements of the present invention can find application also in many other different environments. This way, one or several antennas inside the package can be used to power the chip by coupling the electromagnetic energy captured by the antenna to the biasing circuitry of the chip. This becomes advantageous for those packages that are to be used in very low-consumption devices or where they only need to react to an external electromagnetic signal interrogating the system inside the package, such as it is the case in radio frequency identification systems (RFID).

Other possible uses of the package beside communication or wireless systems are sensors. In some embodiments the package integrates a sensor or sensing system besides the chip and the antenna. In other cases the antenna itself is used a sensing device for some type of electromagnetic signal or physical magnitude. When this is combined with a remote feeding scheme as described above, such packages can become suitable for low-cost applications where the sensor is to be located in remote areas with a difficult access. This includes sensors inside human bodies or animals, sensor inside cars, sensors inside tires or chemical containers, sensors for dangerous environments such as flammable or explosive gases, or liquids. Some of the physical properties that could be sensed in those arrangements include, but are not limited to: temperature, pressure, tension, traction, acceleration, vibration, distance, speed, rotation, light intensity, electromagnetic field intensity, chemical concentration of a chemical component inside a material, electromagnetic or acoustic doppler shift or motion.

Is to be understood that even though various embodiments and advantages of the present invention have been described in the foregoing description, the above disclosure is illustrative only, and changes may be made in details, yet remaining within the spirit and scope of the present invention, which is to be limited only by the appended claims.

What is claimed is:

1. A wireless system comprising:
   a substrate;
   a chip mounted on the substrate;
   a sensor mounted on the substrate;
   a first antenna mounted on the substrate and enclosed in a first rectangular area that does not enclose the chip, the first antenna comprising a first conducting pattern having a perimeter, wherein the perimeter of the first conducting pattern defines a first curve comprising at least five segments, wherein: each of the at least five segments forms an angle with each adjacent segment, at least three of the segments are smaller than a tenth of a longest free-space operating wavelength of the first antenna, each angle between adjacent segments is less than 180°, and at least two of the angles between adjacent segments are less than 115°; and
   a second antenna mounted on the substrate and enclosed in a second rectangular area having a longer side shorter than one-fifth of a longest free-space operating wavelength of the second antenna, wherein the second rectangular area does not enclose the chip, and the second antenna is located close to an edge of the substrate.

2. The wireless system of claim 1, wherein at least one of the angles between adjacent segments is 90°.

3. The wireless system of claim 2, wherein at least two of the angles between adjacent segments are not equal.

4. The wireless system of claim 3, wherein at least two of the angles between adjacent segments that are less than 115° are defined in the clockwise and counter-clockwise directions at opposite sides of the first curve.

5. The wireless system of claim 1, wherein the second antenna is a monopole antenna.

6. The wireless system of claim 1, wherein the first antenna is configured to provide operation in at least two different non-overlapping frequency bands used by at least two cellular services.

7. The wireless system of claim 1, wherein the second antenna comprises a second conducting pattern, and the perimeter of the second conducting pattern defines a second curve comprising at least fifteen segments.

8. A device comprising:
a substrate;
a chip and a sensor mounted on the substrate;
a first antenna mounted on the substrate and arranged close to an edge of the substrate, the first antenna comprising a first conducting pattern that is enclosed in a first rectangular area, wherein a perimeter of the first conducting pattern defines a first curve comprising at least five segments, each of the at least five segments forming an angle with each adjacent segment in the first curve, and wherein at least two of the angles are not equal; and
a second antenna mounted on the substrate and arranged close to an edge of the substrate, the second antenna comprising a second conducting pattern that is enclosed in a second rectangular area, a longest side of the second rectangular area being shorter than one-fifth of a longest free-space operating wavelength of the second antenna,
wherein the first rectangular area and the second rectangular area do not enclose the chip.

9. The device of claim 8, wherein the second antenna comprises a first arm and a second arm.

10. The device of claim 9, wherein the perimeter of the first arm defines a second curve comprising at least five segments, each of the at least five segments forming an angle with each adjacent segment in the second curve, and wherein at least two of the angles are not equal.

11. The device of claim 10, wherein the perimeter of the second arm defines a third curve comprising at least five segments, each of the at least five segments forming an angle with each adjacent segment in the third curve, and wherein at least two of the angles are not equal.

12. The device of claim 8, wherein the longest side of the second antenna is arranged substantially parallel to an edge of the substrate.

13. The device of claim 12, wherein the first and second antennas are located on opposite edges of the substrate.

14. The device of claim 8, wherein at least five of the segments are smaller than a tenth of the longest free-space operating wavelength of the first antenna.

15. The device of claim 14, wherein each angle between adjacent segments is less than 180° and at least two of the angles between adjacent sections are less than 115°.

16. The device of claim 8, wherein the second antenna is configured to provide operation in at least two different non-overlapping frequency bands used by at least two cellular services.

17. A device comprising:
a substrate;
at least one die and at least two sensors mounted on the substrate;
a first antenna mounted on the substrate, a longest side of the first antenna being arranged substantially parallel to an edge of the substrate, the first antenna fitting inside a first rectangular area having a longer side shorter than one-fifth of a longest free-space operating wavelength of the first antenna, wherein: a perimeter of the first antenna defines a first curve comprising at least five segments, each of the at least five segments forms an angle with each adjacent segment, at least three of the at least five segments are shorter than one-tenth of the longest free-space operating wavelength of the first antenna, each angle between adjacent segments is less than 180°, and at least two of the angles between adjacent segments are less than 115°; and
a second antenna mounted on the substrate, a longest side of the second antenna being arranged substantially parallel to an edge of the substrate, the second antenna fitting inside a second rectangular area comprising a conducting pattern, a perimeter of the conducting pattern defining a second curve comprising at least five segments,
wherein the first rectangular area and the second rectangular area do not enclose the at least one die.

18. The device of claim 17, wherein the second antenna comprises a first arm and a second arm.

19. The device of claim 18, wherein the perimeter of the first arm defines a third curve comprising at least five segments, each of the at least five segments forming an angle with each adjacent segment in the third curve, and wherein at least two of the angles are not equal.

20. The device of claim 19, wherein the perimeter of the second arm defines a fourth curve comprising at least five segments, each of the at least five segments forming an angle with each adjacent segment in the fourth curve, and wherein at least two of the angles are not equal.

* * * * *